(12) United States Patent
VanderKoy et al.

(10) Patent No.: US 10,736,036 B2
(45) Date of Patent: Aug. 4, 2020

(54) SLEEP CURRENT FAILURE DETECTION

(71) Applicant: Trane International Inc., Davidson, NC (US)

(72) Inventors: Christopher C. VanderKoy, St. Paul, MN (US); Joel C. VanderZee, LaCrosse, WI (US)

(73) Assignee: Trane International Inc., Davidson, NC (US)

( * ) Notice: Subject to any disclaimer, the term of this patent is extended or adjusted under 35 U.S.C. 154(b) by 503 days.

(21) Appl. No.: 15/644,384

(22) Filed: Jul. 7, 2017

(65) Prior Publication Data

US 2017/0310100 A1    Oct. 26, 2017

Related U.S. Application Data

(63) Continuation of application No. 15/542,320, filed as application No. PCT/US2016/013234 on Jan. 13, 2016, now Pat. No. 10,560,894.

(Continued)

(51) Int. Cl.
*H04W 52/02* (2009.01)
*G06F 1/3206* (2019.01)
(Continued)

(52) U.S. Cl.
CPC ......... *H04W 52/0229* (2013.01); *F24F 11/30* (2018.01); *G01R 19/16519* (2013.01);
(Continued)

(58) Field of Classification Search
CPC ............. H04W 52/0229; H04W 84/18; H04W 52/0254; H04W 52/0261; H04W 52/0245;
(Continued)

(56) References Cited

U.S. PATENT DOCUMENTS 4,969,508 A    11/1990  Tate et al.
5,657,317 A     8/1997  Mahany et al.
(Continued)

OTHER PUBLICATIONS

Simplicity Studio product brochure, Silicon Laboratories Inc., Feb. 2014.

(Continued)

*Primary Examiner* — Dharti H Patel
(74) *Attorney, Agent, or Firm* — The Salerno Law Firm, P.C.

(57) ABSTRACT

HVAC components having improved efficiency are described. In one embodiment, excessive sleep current draw in a battery-powered device having a microcontroller is detected by measuring a voltage drop across a MOSFET device coupled in a forward-conducting orientation in series between the battery and the microcontroller, causing a transistor to conduct when the voltage drop exceeds a predetermined threshold to generate a first trigger signal, integrating the first trigger signal to generate a second trigger signal, and generating an interrupt to the microcontroller. In another embodiment, a battery-saving method of operating an HVAC component includes maintaining the HVAC device in the sleep mode, receiving a user input to wake the device, transmitting a data request and returning the HVAC component to the sleep mode, waking up the HVAC device to poll an adjacent network node storing a cached response, displaying the response, and returning the HVAC device to sleep.

6 Claims, 14 Drawing Sheets

Related U.S. Application Data

(60) Provisional application No. 62/107,074, filed on Jan. 23, 2015, provisional application No. 62/102,968, filed on Jan. 13, 2015.

(51) Int. Cl.

| | |
|---|---|
| *H04L 12/00* | (2006.01) |
| *H04L 12/64* | (2006.01) |
| *F24F 11/30* | (2018.01) |
| *G01R 19/165* | (2006.01) |
| *G05B 15/02* | (2006.01) |
| *H02H 1/00* | (2006.01) |
| *H02H 3/20* | (2006.01) |
| *G06F 1/3209* | (2019.01) |
| *H02H 3/38* | (2006.01) |
| *H04L 1/16* | (2006.01) |
| *H04L 12/747* | (2013.01) |
| *G06K 19/07* | (2006.01) |
| *F24F 11/52* | (2018.01) |
| *H04W 84/18* | (2009.01) |
| *F24F 140/60* | (2018.01) |
| *F24F 11/46* | (2018.01) |
| *F24F 11/56* | (2018.01) |

(52) U.S. Cl.
CPC ........... *G05B 15/02* (2013.01); *G06F 1/3206* (2013.01); *G06F 1/3209* (2013.01); *H02H 1/0007* (2013.01); *H02H 3/20* (2013.01); *H02H 3/38* (2013.01); *H04L 1/1685* (2013.01); *H04L 12/00* (2013.01); *H04L 12/6418* (2013.01); *H04L 45/742* (2013.01); *H04W 52/0245* (2013.01); *H04W 52/0254* (2013.01); *H04W 52/0261* (2013.01); *F24F 11/46* (2018.01); *F24F 11/52* (2018.01); *F24F 11/56* (2018.01); *F24F 2140/60* (2018.01); *G06K 19/0702* (2013.01); *H04W 84/18* (2013.01); *Y02D 70/00* (2018.01); *Y02D 70/144* (2018.01); *Y02D 70/162* (2018.01); *Y02D 70/22* (2018.01)

(58) Field of Classification Search
CPC ... H04L 12/6418; H04L 12/00; H04L 45/742; H04L 1/1685; G06F 1/3206; G06F 1/3209; H02H 3/38; H02H 3/20; H02H 1/0007; G05B 15/02; G01R 19/16519; F24F 11/30; F24F 11/56; F24F 11/46; F24F 2140/60; F24F 11/52; Y02D 70/162; Y02D 70/22; Y02D 70/144; Y02D 70/00; G06K 19/0702

USPC ........................................................ 361/93.1
See application file for complete search history.

(56) References Cited

U.S. PATENT DOCUMENTS

| | | | |
|---|---|---|---|
| 6,553,336 B1 | 4/2003 | Johnson et al. | |
| 7,865,252 B2 | 1/2011 | Clayton | |
| 8,102,799 B2 | 1/2012 | Alexander et al. | |
| 8,249,731 B2 | 8/2012 | Tran et al. | |
| 8,511,576 B2 | 8/2013 | Warren et al. | |
| 8,511,577 B2 | 8/2013 | Warren et al. | |
| 8,532,827 B2* | 9/2013 | Stefanski | F24F 11/50 |
| | | | 700/276 |
| 8,560,128 B2 | 10/2013 | Ruff et al. | |
| 8,586,925 B2 | 11/2013 | Willden | |
| 8,659,302 B1 | 2/2014 | Warren et al. | |
| 8,677,342 B1 | 3/2014 | Kidder et al. | |
| 8,742,901 B2 | 6/2014 | Miller et al. | |
| 8,770,491 B2 | 7/2014 | Warren et al. | |
| 8,788,103 B2 | 7/2014 | Warren et al. | |
| 8,873,444 B2 | 10/2014 | Tiberi et al. | |
| 8,942,853 B2 | 1/2015 | Stefanski et al. | |
| 8,963,726 B2 | 2/2015 | Kates | |
| 8,963,727 B2 | 2/2015 | Kates | |
| 8,963,728 B2 | 2/2015 | Kates | |
| 8,981,950 B1 | 3/2015 | Kates | |
| 9,026,254 B2 | 5/2015 | Warren et al. | |
| 9,077,183 B2 | 7/2015 | Thomas et al. | |
| 9,086,703 B2 | 7/2015 | Warren et al. | |
| 9,214,702 B2* | 12/2015 | Noda | H01M 10/482 |
| 9,268,344 B2 | 2/2016 | Warren et al. | |
| 9,435,559 B2 | 9/2016 | Warren et al. | |
| 9,448,567 B2* | 9/2016 | Warren | F24D 19/1039 |
| 9,483,064 B2 | 11/2016 | McPherson | |
| 9,791,839 B2 | 10/2017 | Matsuoka et al. | |
| 9,838,652 B2 | 12/2017 | Chien | |
| 2008/0151454 A1* | 6/2008 | Uhl | B60R 21/017 |
| | | | 361/87 |
| 2010/0298957 A1 | 11/2010 | Sanchez Rocha et al. | |
| 2012/0031984 A1 | 2/2012 | Feldmeier et al. | |
| 2013/0201316 A1 | 8/2013 | Binder et al. | |
| 2014/0175181 A1 | 6/2014 | Warren et al. | |
| 2015/0108901 A1 | 4/2015 | Greene et al. | |

OTHER PUBLICATIONS

Extended European Search Report, EP Application No. 17183956.6, dated Jan. 22, 2018.

* cited by examiner

SLEEP CURRENT FAILURE DETECTION

CROSS-REFERENCE TO RELATED APPLICATIONS

This application is a Continuation of U.S. application Ser. No. 15/542,320 entitled "MESH ROUTING OF SLEEPY SENSOR DATA" and filed Jul. 7, 2017, which is a U.S. National Phase Application filed under 35 U.S.C. § 371 of International Application PCT/US16/13234 entitled "IMPROVED WIRELESS HVAC COMPONENTS" and filed Jan. 13, 2016, which claims the benefit of and priority to U.S. Provisional Application Ser. No. 62/102,968 entitled "IMPROVED WIRELESS HVAC COMPONENTS" and filed Jan. 13, 2015, and U.S. Provisional Application Ser. No. 62/107,074 entitled "IMPROVED WIRELESS HVAC COMPONENTS" and filed Jan. 23, 2015, the entirety of each of which is hereby incorporated by reference herein for all purposes.

BACKGROUND

1. Technical Field

The present disclosure is directed to systems, apparatus, and methods for improving wireless HVAC components, and in particular, HVAC sensors and HVAC controllers having reduced power consumption, lower manufacturing costs, and increased reliability.

2. Background of Related Art

Heating, ventilation, and air conditioning systems (HVAC systems) typically utilize one or more sensors, thermostats, and/or HVAC controllers to monitor environmental conditions in a building and to operate HVAC equipment installed at the building. Prior art systems utilize components which are interconnected using traditional hard-wiring techniques using electrical conductors routed within the physical structure. Hard-wired systems are generally reliable, but the costs of cabling and installation are high. This is particularly true when installing devices in existing structures where cabling must be snaked through walls and ceilings. More recently, the use of wireless HVAC devices has become popular since installation is simple and low-cost. Existing wireless devices may have drawbacks in that the batteries used in these devices have a limited lifespan and require periodic maintenance and replacement to ensure the HVAC system continues to function reliably. Depending on various system requirements, such wireless sensors, HVAC controllers, and other wireless devices may be required to include, or not include, a user-visible panel or user interface. The need to design, test, and manufacture different versions of wireless devices increases costs and reduces profits and market advantage. A wireless HVAC device which offers reduced power consumption, lower manufacturing costs, and increased reliability would be a welcome advance in the art.

SUMMARY

In one aspect, the present disclosure is directed to a method of sensing excessive sleep current draw in a battery-powered device having a microcontroller. In an embodiment, the disclosed method includes measuring a voltage drop across a MOSFET device coupled in a forward-conducting orientation in series between the battery and the microcontroller; causing a transistor to conduct when the voltage drop exceeds a predetermined threshold to generate a first trigger signal; integrating the first trigger signal to generate a second trigger signal; and generating an interrupt to the microcontroller in response to the second trigger signal. In an embodiment, the predetermined threshold is consistent with excessive current draw during sleep. In an embodiment, the method includes transmitting, from the microcontroller, a fault signal in response to the interrupt.

In another aspect, the present disclosure is directed to a sleep current fault detection circuit for use with a powered device operable in a sleep mode and an awake mode. In an embodiment, the circuit includes a MOSFET, the drain terminal thereof coupled to a current source, the gate terminal thereof coupled to a powered device, the source terminal thereof coupled to ground; a first transistor, the emitter terminal thereof coupled to the drain terminal of the MOSFET and configured to conduct when the voltage across the drain terminal of the MOSFET and the source terminal of the MOSFET exceeds a predetermined voltage; a second transistor, the base terminal thereof coupled to the collector of the first transistor, the collector terminal thereof coupled to an R-C filter; and a third transistor, the base terminal thereof coupled to the R-C filter, the collector terminal thereof coupled to an interrupt terminal of the powered device. In an embodiment, the gate terminal of the MOSFET may be coupled to an output of the powered device. In an embodiment, the output of the powered device turns off the MOSFET prior to entering sleep mode. In an embodiment, the output of the powered device turns on the MOSFET when entering awake mode. In an embodiment, predetermined voltage may be about 0.5 volts.

In yet another aspect, the present disclosure is directed to an energy-efficient method of transmitting data from the end node to a destination node in a mesh network having an end node operable in a sleep mode and an awake mode. The method includes transmitting a first message, the first message including a tag ID of the destination node and message data, from the end node to a parent node of the end node; receiving, at the end node, a first acknowledgement from the parent node acknowledging receipt of the first message by the parent node; causing the end node to enter sleep mode in response to the acknowledgement; determining, at the parent node, whether the parent node is the destination node; and transmitting a second message, the second message including the destination node tag, the message data, and a network address of the parent node, to the destination node in response to determination that the parent node is not the destination node.

In an embodiment, the method includes storing, at the parent node, a relationship between the tag ID of the end node and a network address of the node from which the intervening node received the second message. In an embodiment, transmitting a second message including data from the first message from the parent node to the destination node includes relaying the second message through an intervening node. In an embodiment, the method includes storing, at the intervening node, a relationship between the tag ID of the end node and a network address of the node from which the intervening node received the second message. In an embodiment, the method includes receiving, at the parent node, a second acknowledgement from the destination node; caching the second acknowledgement at the parent node; receiving, from the end node, a poll request; and transmitting the second acknowledgement to the end node in response to the poll request. In an embodiment, the first acknowledgement includes a data link layer acknowledgement. In an embodiment, the second acknowledgement includes an application layer acknowledgement.

In still another embodiment, the present disclosure is directed to a method of extending battery life in a wireless HVAC component operable in a sleep mode having a first power consumption and in an awake mode having a greater power consumption than when the component is in the first mode. In an embodiment, the method includes operating the HVAC component in the sleep mode; receiving, at a user interface element of the HVAC component, a user input; operating the HVAC component in the awake mode; transmitting, from the HVAC component, a data request message, wherein the data request message includes a device identifier of the destination device from which the data is requested; returning the HVAC component to the sleep mode; forwarding the data request message to the destination device; transmitting, from the destination device, a response to the data request message; returning the HVAC component to the awake mode; polling an adjacent network node by the HVAC component; receiving, at the HVAC component, the response to the data request message; displaying, on the HVAC component, information derived from the response and; returning the HVAC component to the sleep mode. In an embodiment, the method includes caching, at an adjacent network node, the response to the data request message. In an embodiment, the user interface element may include a pushbutton and a proximity sensor. In an embodiment, the forwarding includes relaying the data request message through one or more intervening devices. In an embodiment, the data request message may include a set point, a mode indicator, a temperature indicator, an HVAC system status, a fuel indicator, an energy indicator, a battery level indicator, and a signal strength indicator. In an embodiment, the mode indicator may include a cooling mode indicator, a heating mode indicator, a fan mode indicator, a ventilation mode indicator, and a service mode indicator. In an embodiment, the temperature indicator may include an indoor temperature, an outdoor temperature, a refrigerant temperature, an HVAC equipment inlet temperature, and an HVAC equipment outlet temperature. In an embodiment, the fuel indicator may include a fuel flow rate indicator, a fuel level indicator, and a fuel pressure indicator. In an embodiment, the energy indicator may include a voltage indicator, a current indicator, and an alternating current frequency indicator, a utility energy source indicator and a backup energy source indicator.

In a further embodiment, the present disclosure is directed to a kit for manufacturing an HVAC sensor assemblable in a first configuration having an exposed display and second configuration having a hidden display. In an embodiment, the kit includes a printed circuit board having a display side and a non-display side, the display side including a display module disposed thereon; a first housing assembly having a user surface and a mounting surface; the user surface having a display opening defined therein; the first housing assembly configured to operatively receive the printed circuit board whereby the display module faces the user surface and is visible through the display opening; and a second housing assembly having a user surface and a mounting surface and configured to operatively receive the printed circuit board whereby the display module faces an interior surface of the housing. In an embodiment, the printed circuit board includes a switch assembly disposed on the display side thereof; the first housing assembly further comprises a switch assembly opening defined in the user surface thereof, the switch assembly opening configured to operably receive the switch assembly.

BRIEF DESCRIPTION OF THE DRAWINGS

Various embodiments of the disclosed system and method are described herein with reference to the drawings wherein.

Figure 1:
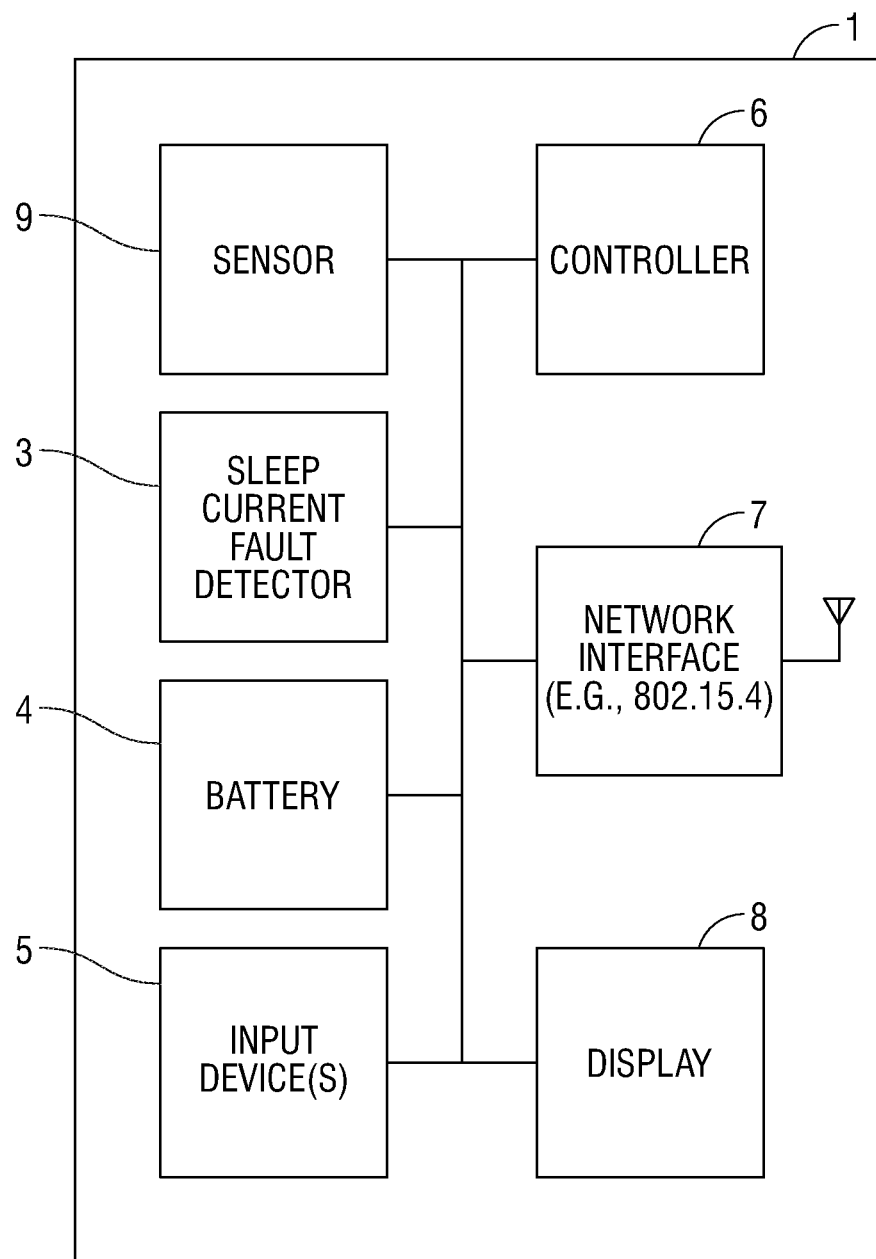
FIG. 1 is a block diagram of an embodiment of an improved wireless HVAC device in accordance with the present disclosure.

The various aspects of the present disclosure mentioned above are described in further detail with reference to the aforementioned figures and the following detailed description of exemplary embodiments.

DETAILED DESCRIPTION

Particular illustrative embodiments of the present disclosure are described hereinbelow with reference to the accompanying drawings; however, the disclosed embodiments are merely examples of the disclosure, which may be embodied in various forms. Well-known functions or constructions and repetitive matter are not described in detail to avoid obscuring the present disclosure in unnecessary or redundant detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. In this description, as well as in the drawings, like-referenced numbers represent elements which may perform the same, similar, or equivalent functions. The word "exemplary" is used herein to mean "serving as an example, instance, or illustration." Any embodiment described herein as "exemplary" is not necessarily to be construed as preferred or advantageous over other embodiments. The word "example" may be used interchangeably with the term "exemplary."

The present disclosure is described herein in terms of functional block components and various processing steps. It should be appreciated that such functional blocks may be realized by any number of hardware and/or software components configured to perform the specified functions. For example, the present disclosure may employ various integrated circuit components, e.g., memory elements, processing elements, logic elements, look-up tables, and the like, which may carry out a variety of functions under the control of one or more microprocessors or other control devices.

Similarly, the software elements of the present disclosure may be implemented with any programming or scripting language such as C, C++, C#, Java, COBOL, assembler, PERL, Python, PHP, or the like, with the various algorithms being implemented with any combination of data structures, objects, processes, routines or other programming elements. The object code created may be executed by any device, on a variety of operating systems, including without limitation RTOS, Apple OSX®, Apple iOS®, Google Android®, HP WebOS®, Linux, UNIX®, Microsoft Windows®, and/or Microsoft Windows Mobile®.

It should be appreciated that the particular implementations described herein are illustrative of the disclosure and its best mode and are not intended to otherwise limit the scope of the present disclosure in any way. Examples are presented herein which may include data items which are intended as examples and are not to be construed as limiting. Indeed, for the sake of brevity, conventional data networking, application development and other functional aspects of the systems (and components of the individual operating components of the systems) may not be described in detail herein. It should be noted that many alternative or additional functional relationships or physical or virtual connections may be present in a practical electronic system or apparatus. In the discussion contained herein, the terms user interface element and/or button are understood to be non-limiting, and include other user interface elements such as, without limitation, pushbutton, a proximity sensor, a hyperlink, clickable image, and the like.

As will be appreciated by one of ordinary skill in the art, the present disclosure may be embodied as a method, a data processing system, a device for data processing, and/or a computer program product. The present disclosure may take the form of a computer program product on a computer-readable storage medium having computer-readable program code means embodied in the storage medium. Any suitable computer-readable storage medium may be utilized, including hard disks, CD-ROM, DVD-ROM, optical storage devices, magnetic storage devices, semiconductor storage devices (e.g., EEPROM, mask ROM, flash memory, USB thumb drives) and/or the like.

Computer program instructions embodying the present disclosure may also be stored in a computer-readable memory that can direct a computer or other programmable data processing apparatus to function in a particular manner, such that the instructions stored in the computer-readable memory produce an article of manufacture, including instruction means, that implement the function specified in the description or flowchart block(s). The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the present disclosure.

One skilled in the art will also appreciate that, for security reasons, any components, data structures, and communications links may include any of various suitable security features, such as firewalls, access codes, encryption, de-encryption, compression, decompression, and/or the like. In some instances, the steps recited herein may be executed in any order and are not limited to the order presented.

Exemplary embodiments are disclosed herein which operate in accordance with the ZigBee® wireless mesh networking standards, however, it should be understood that embodiments of the present disclosure are applicable to any wired or wireless network architecture, including without limitation Z-Wave®, in which the features and advantages discussed herein may be advantageously employed.

Referring to FIG. 1, a wireless HVAC device 1 in accordance with the present disclosure is shown. Wireless HVAC device 1 includes a battery 4 or other power source configured to provide operating power to a microcontroller 6, a network interface 7, one or more input devices 5, and/or a display 8. Microcontroller 6 may include a processor, and a memory operatively associated with the processor, the memory storing executable instructions, which, when executed on the processor, perform one or more of the methods described herein. Wireless HVAC device 1 includes a sleep current fault detector 3 which detects excessive current draw from battery 4 when HVAC device 1 is in a low-power, or "sleep" mode. Sleep current fault detector 3 includes sleep current fault detection circuit 10, discussed in detail below.

Display 8 may include, without limitation, an LCD display, an electronic paper display (e-paper) or any other suitable display which meets the low-power and environmental requirements for an HVAC sensor. Display 8 may be externally viewable during normal use, or may be concealed from view during normal use but visible during an initial setup task, as described below. Input device(s) 5 may include one or switches, pushbuttons, touchscreen, proximity sensor, or other input device. HVAC device 1 includes a sensor 9, such as, without limitation, a temperature sensor, a humidity sensor, a barometric pressure sensor, a light sensor, a proximity sensor, and the like.

Network interface 7 may include a radiofrequency (RF) transceiver that is configured to facilitate communications in accordance with the 802.15.4 standard. In embodiments, network interface 7 operates in accordance with the Zig-Bee® wireless communications protocol.

Figure 2:
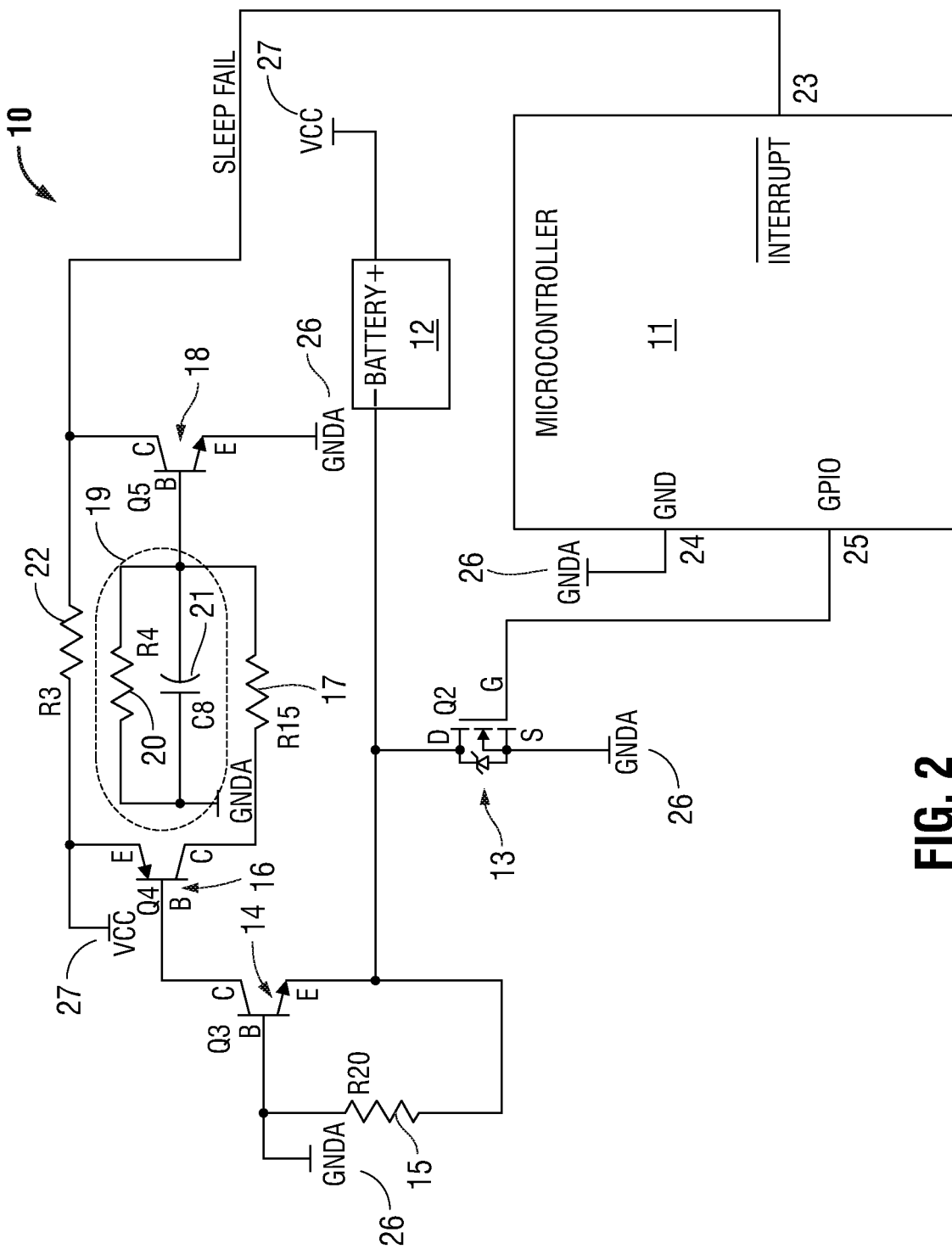
FIG. 2 is a schematic diagram of an embodiment of a sleep current fault detection circuit in accordance with the present disclosure.

With reference to FIG. 2, a sleep current fault detection circuit 10 is disclosed. Circuit 10 is adapted to work with a device 11, which may include a microcontroller, radio module, or any other integrated or discrete circuit, which is operable in a normal, "awake" or "active" mode, and a low-power or "sleep" mode. Sleep current fault detection circuit 10 is suitable for battery-powered devices that spend a significant amount of time in a low-powered (e.g., sleep) mode. While such a device is sleeping, if a fault occurs and current draw increases, battery life can be dramatically shortened. The disclosed sleep current fault detection circuit 10 is designed to detect such failures, with negligible energy consumption.

With continued reference to FIG. 2, a positive terminal of battery 12 is coupled to Vcc. A MOSFET 13 (Q2) is coupled in series between a negative terminal of battery 13 and ground 26. MOSFET 13 is configured such that the body diode of MOSFET 13 is in a forward conducting state when device 11 is powered up e.g., the drain terminal of MOSFET 13 is coupled to the negative terminal of battery 12, and the source terminal of MOSFET 13 is coupled to ground 26. Note that, because of the voltage drop across the drain and source of MOSFET 13, the negative terminal of battery 12 will be at a lower potential than ground 26. Ground terminal 24 of device 11 is also connected to ground 26.

In operation, before entering sleep mode, MOSFET 13 is turned off via GPIO output 25. When device 11 awakes from sleep, MOSFET 13 is turned on via GPIO output 25. During sleep mode, if the current consumed by device 11 increases, so too does the voltage drop across the drain and source of MOSFET 13. During sleep mode with MOSFET 13 off, this voltage drop is about 0.3V. If device 11 increases current draw during sleep, the voltage drop across MOSFET 13 will increase. Therefore, by detecting this increase in voltage drop, the current draw of device 11 is determined. If the voltage drops exceeds a predetermined limit, e.g., greater than approximately 0.5V, an interrupt is flagged to an interrupt terminal 23 of device 11. Advantageously, device 11 includes the capability to monitor the activity of interrupt terminal 23 while in sleep mode, and execute a task (wake up, execute an interrupt handler, etc.) in response to the sleep fault condition. In a typical scenario, the current draw of device 11 may be about 2 uA during sleep. A sleep current failure circuit in accordance with the present example embodiment will detect an increase in sleep current draw of one or more orders of magnitude. So, for example, a sleep current circuit in accordance with the present example embodiment will trigger at about a 20 uA current draw. Other embodiments are contemplated which detect even smaller changes of current flow. In embodiments, The disclosed sleep current fault detection circuit 10 may be configured to detect sleep current faults in other circuit elements in addition to, or alternatively to, device 11.

The emitter terminal of a transistor 14 (Q3) is coupled to the drain of MOSFET 13. The base of transistor 14 is coupled to ground 26. During normal sleep mode, the base-emitter voltage across resistor 15 (R20), corresponding to the voltage drop across MOSFET 13, is low, which causes transistor 14 to remain off. If, however, a sleep fault occurs which results in excessive current draw, transistor 14 will switch on. Transistor 16 (Q4) and transistor 18 (Q5) are configured as buffered gain stages which drive an interrupt terminal 23 of device 11 when a sleep power fault is detected. An R-C network 19 formed by resistor 20 (R4) and capacitor 21 (C8) delays the turn-on time of transistor 18 to prevent false positives and other spurious or transient conditions from triggering the interrupt to device 11.

Device 11 monitors interrupt terminal 23 while in sleep mode. When transistor 18 turns on, interrupt terminal 23 is pulled low which causes device 11 to wake up and perform a desired task. For example, device 11 can display an error code, transmit to a receiver that it has a sleep current issue, power down sections of the sensor to isolate the problem, or perform any other task which may be appropriate in response to a sleep current failure.

Turning to FIGS. 3A-3F, a prior art ZigBee® wireless mesh network 30 is shown. A typical ZigBee® network includes one router acting as the coordinator 31, optionally one or more other routers 32 and optionally one or more end nodes 33. The coordinator 31 and other router(s) 32 includes the capability to act as an intermediary to relay data from source devices to destination devices. Both the coordinator 31 and router(s) are maintained in a powered-up mode, that is, neither coordinator 31 nor router 32 may go into sleep mode. The end node(s) 33 may include functionality to perform a task (such as sensing a condition or accepting a user input). An end node 33 communicates through a coordinator 31 or a router 32 and is called a child of that router, which is called the parent of that end node. A parent node communicates directly with its child node(s) and relays messages between its child node(s) and other nodes in the mesh network. An end node 33 may enter a sleep mode, and, in practice, may be in sleep mode most of the time to conserve battery life. Additionally, end nodes 33 typically include a relatively modest amount of computing resources, and therefore are typically less expensive to manufacture than a coordinator 31 or router 32.

Prior art network 30 typically operates as follows: Assume end node 33 is to send a message to destination node 32c. A message is typically formed by one or more packets containing a destination address corresponding to the destination node, and the data to be sent to the destination node. The message is sent from the end node 33 to the parent node 32a and may be relayed through one or more other router nodes until it reaches the destination. At each handoff, the receiving node transmits a low-level acknowledgement (e.g., a data link layer, or MAC acknowledgement, etc.) to the sending node to confirm receipt. When the message reaches the destination node, the destination node, if requested, sends a higher-level acknowledgement message, such as an APS acknowledgement (APS ack), back to the originating node. The APS ack may be relayed to the originating node through the same series of nodes in reverse, or may take a different route.

The source of a message, such as end node 33, must determine the destination address of the destination node. To determine the destination address, a station tag ID which includes identifying information relating to the destination node is used to determine the destination address. The destination address itself is not typically used as the tag ID, because network addresses are randomly assigned and may change in a ZigBee® network. Tags may include, for example, the MAC address of a wireless node, a protocol address of a ZigBee® device implementing the generic tunnel cluster, or some independent information configured by a user through a user interface, such as the settings of jumpers or rotary dial switches or via a touch screen, buttons, etc.

Figure 3A:
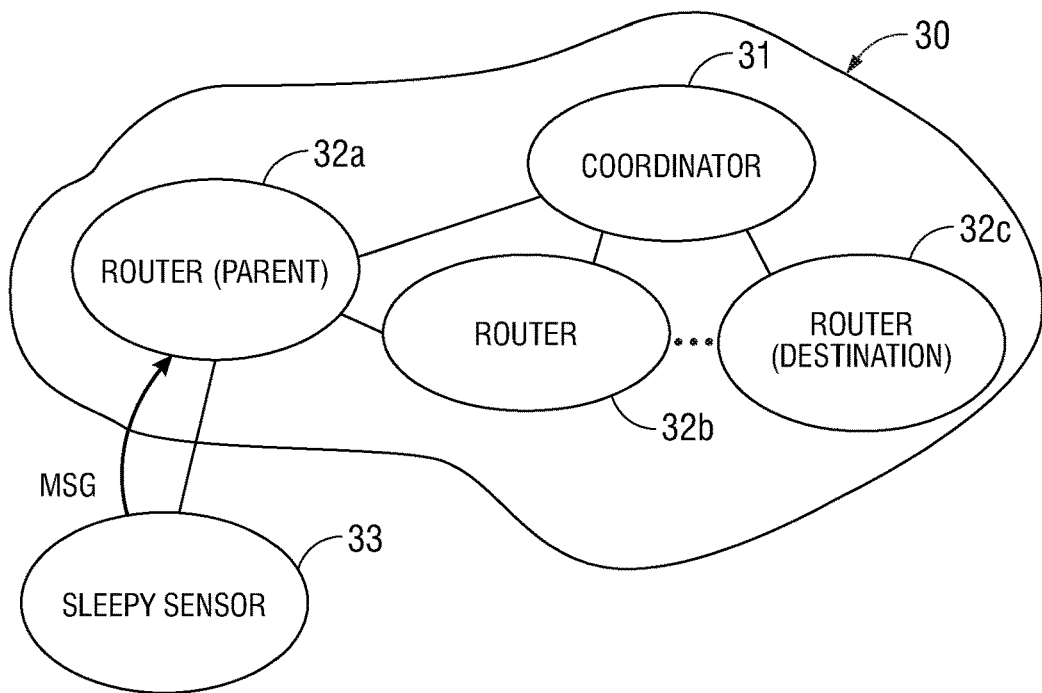
FIGS. 3A-3F are diagrams illustrating a prior art mesh network.
Figure 3B:
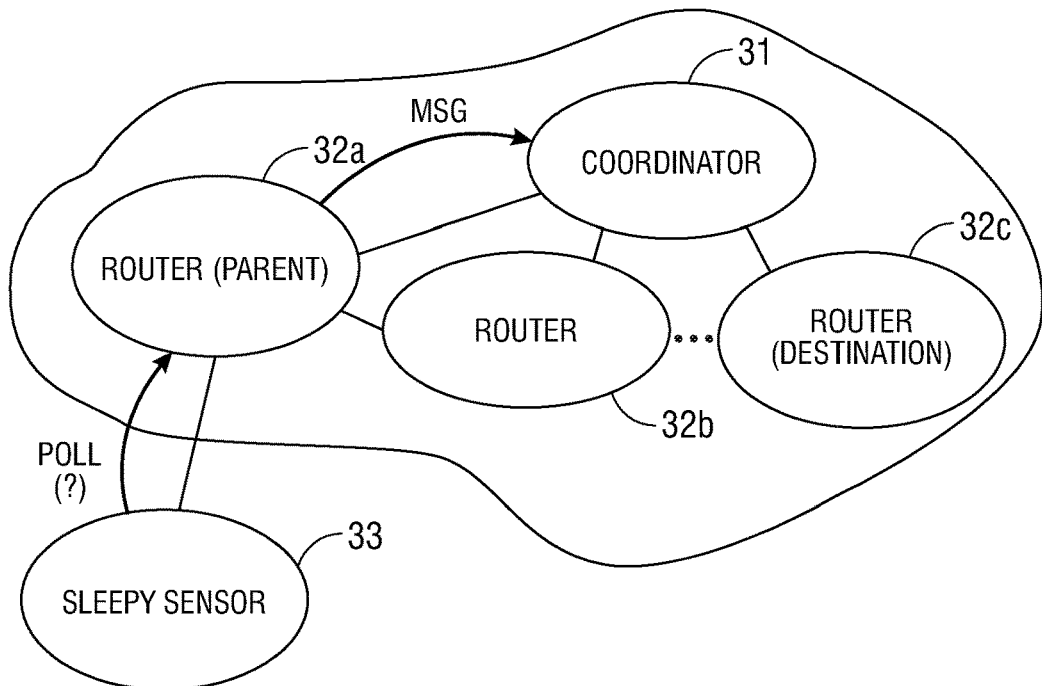
Figure 3C:
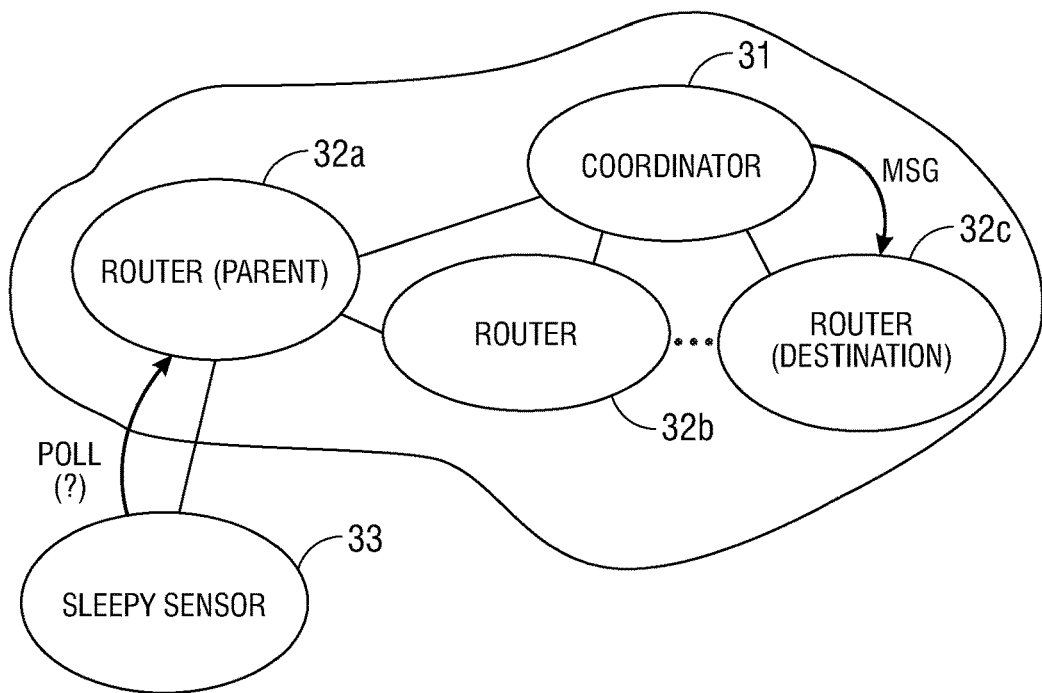
Figure 3D:
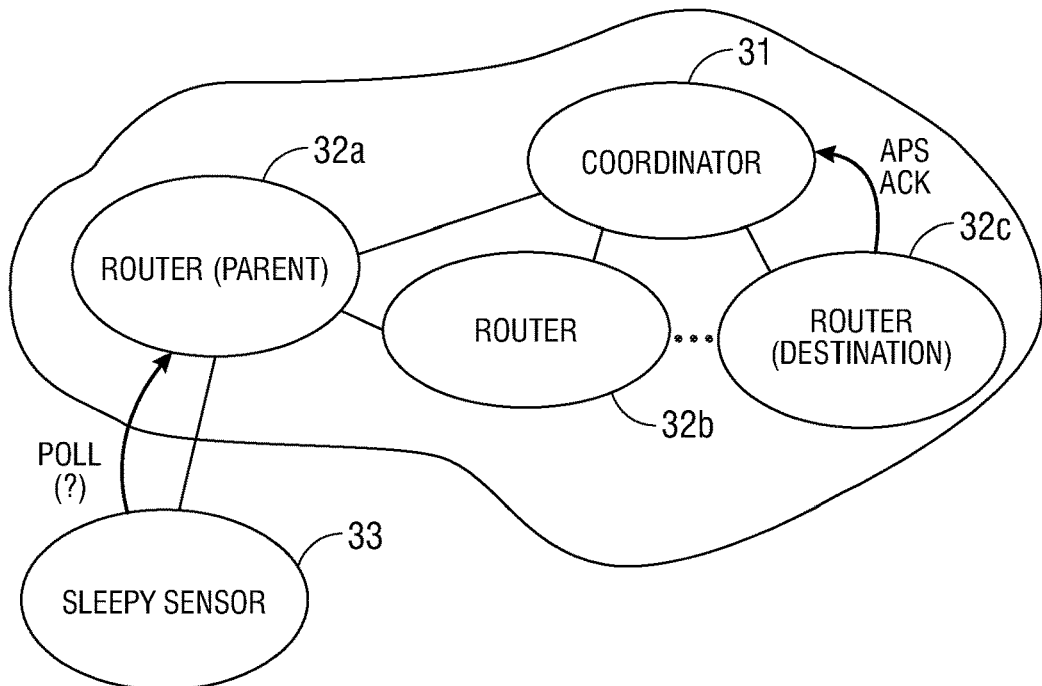
Figure 3E:
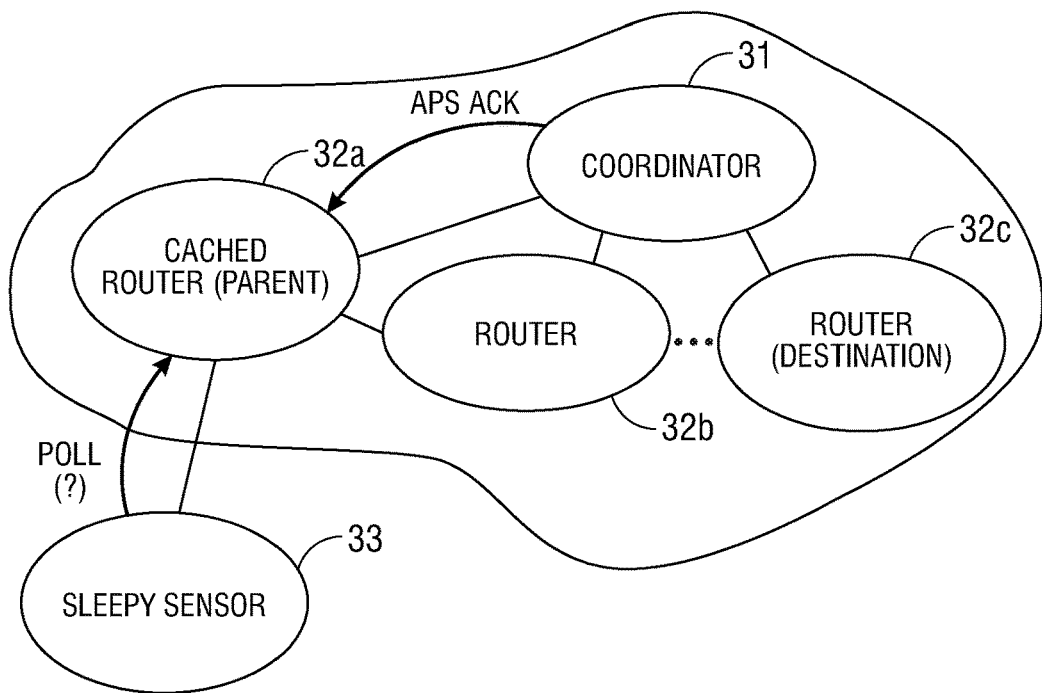
Figure 3F:
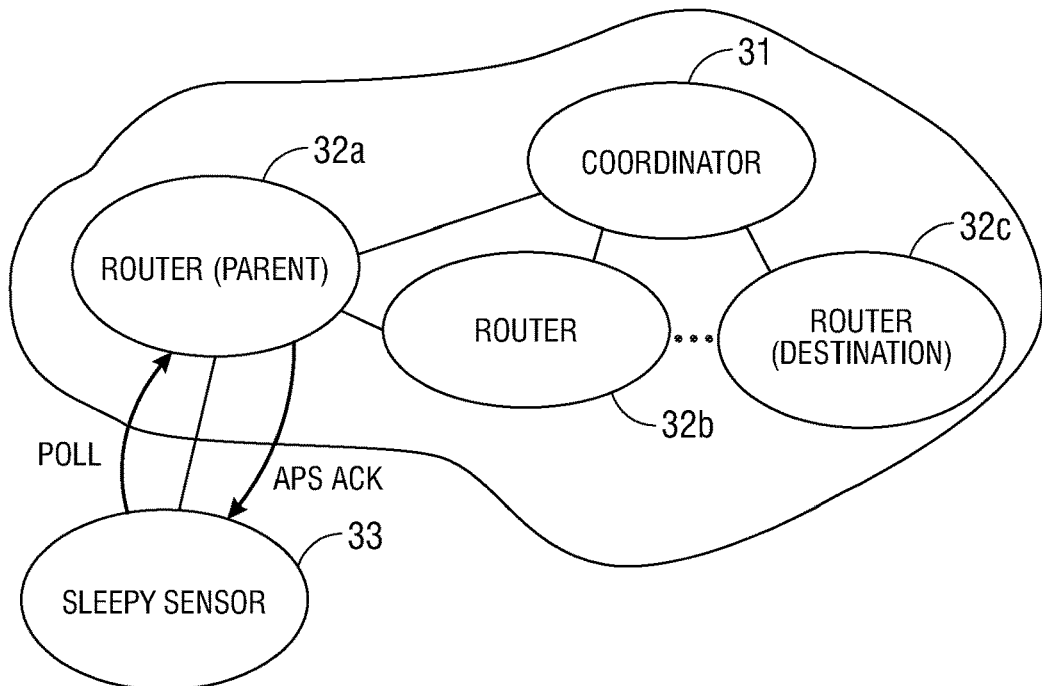

As seen in FIG. 3A, end node 33 wakes up to send a message containing data to, for example, router 32c. Before sending the message the first time to a destination, the address of the destination node must be determined by end node 33. End node 33 queries the network to obtain the address of the destination node. For example, the ZigBee® standard provides for broadcast requests to discover a node having a specified MAC address, and the generic tunnel cluster provides broadcast requests to match a protocol address to a node. An application can, in general, provide for discovery of the node matching any desired tag. End node 33 then formats the message by combining the message data with the address of the destination node (router 32c) to form one or more message packets. The message is then transmitted to the parent node, which, in the present example, is router 32a. The receiving node (here, router 32a) will transmit a MAC acknowledgement to the transmitting node (here, end node 33) to confirm receipt of the transmitted packet at the data link level. Router 32a receives the message, examines the destination address, determines that the destination address belongs to a node other than itself, and, as seen in FIG. 3B, forwards the message to the next node. If router 32a does not have a stored route for reaching the destination node, then router 32 must discover a route before forwarding the message. In some instances, router 32 may discard the message, only forwarding messages that end node 33 sends in the future when router 32 has a stored route to the destination. Continuing with the present example, the next node is coordinator 31. Coordinator 31 repeats the process, and as shown in FIG. 3C, forwards the message to the destination node e.g., router 32c. Upon receipt, the destination node transmits an application acknowledgement message (APS ack) to the originating end node 33 via the reverse path from the original message as shown in FIGS. 3D, 3E, and 3F. A function of APS acks is to enhance reliability. Since any one relay has a probability of failing, based on the wireless link quality, and the overall probability of failure to deliver the message to the destination is the probability that any one relay fails, the ZigBee® application support layer can use APS acks to determine when to repeat sending a message so that message delivery is more reliable. Another function of APS acks is to facilitate the detection of when a destination address changes, so that the source can determine the new address for the destination.

Several drawbacks exist in such prior art networks. An end node uses battery power to wake up repeatedly to poll its parent node as the end node attempts to receive the APS ack for each message it sends. The time and power required may include time and power used for route discovery and repeated transmissions. Each router maintains a routing table to store the next relay for each destination to which it can forward packets in the mesh network. Such routing tables are allocated a finite amount of memory and therefore can hold only up to a certain number of entries. In order to make room for new routes, stale entries which are older and/or lesser-used are purged from the table. To avoid unnecessary route discovery processes, the tables must be large enough to contain entries for addresses of data destinations and end devices (which are destinations of APS acks). These requirements are costly in terms of power consumption and computing resource usage.

FIGS. 4A-4F illustrate an exemplary embodiment of an energy-efficient wireless mesh network 50 that significantly extends battery life by minimizing the amount of time the end node needs to be awake, and by delegating responsibility for finding the destination address to the router. Embodiments of the present disclosure eliminate the need for repetitive wake/poll/sleep cycles to receive an application acknowledgement by allowing a message to be reliably dispatched from an end node using a single radio transmission, while maintaining network reliability by sending the message with APS acks to the destination.

Figure 4A:
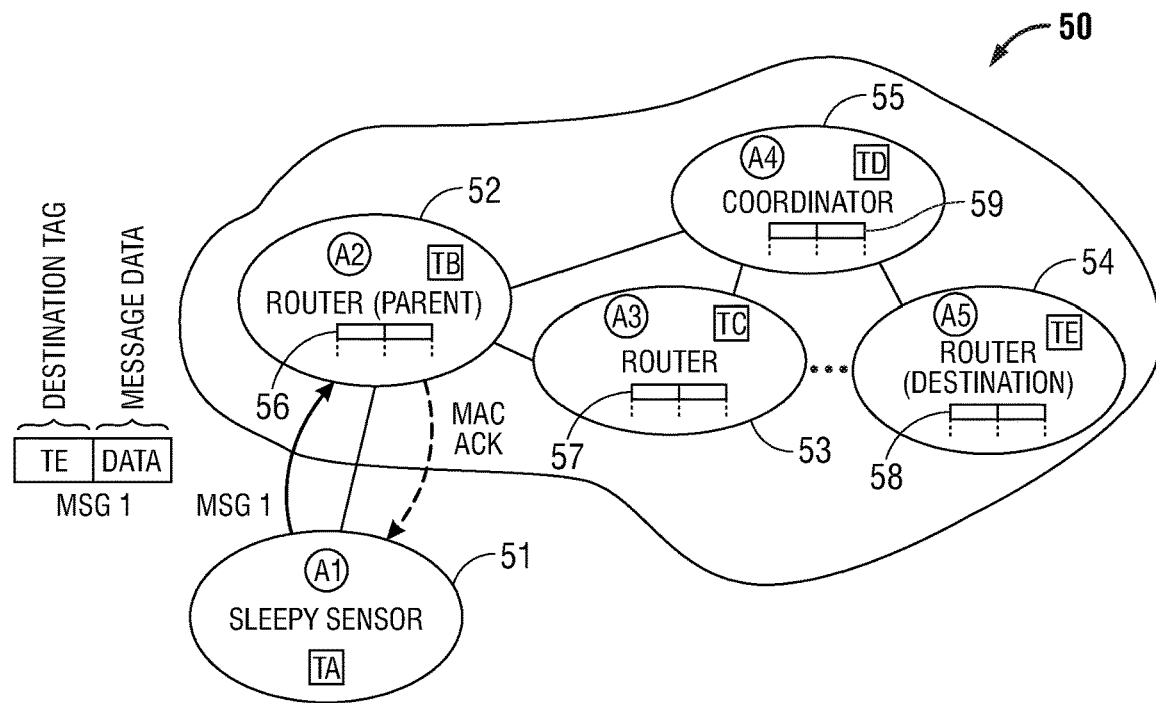
FIGS. 4A-4F are diagrams illustrating aspects of an energy-efficient mesh network in accordance with an embodiment of the present disclosure.

With reference to FIG. 4A, the network 50 includes a battery-powered end node 51, router nodes 52, 53, and 54, and coordinator node 55. The network configuration shown in the FIGS. 4A-4F is exemplary, and it is to be understood that embodiments having other configurations, e.g., different numbers and types of nodes, links, devices, and the like, are contemplated within the scope of the present disclosure. Each node is assigned a logical node address. In the present embodiment, end node 51 is assigned an address of A1, routers 52, 53, and 54 are assigned addresses A2, A3, and A5, respectively, and coordinator 55 is assigned address A4. End node 51 is assigned a tag of TA, routers 52, 53, and 54 are assigned tags TB, TC, and TE, respectively, and coordinator 55 is assigned tag TD. Routers 52, 53, and 54 include an address map 56, 57, 58, respectively, and coordinator 55 includes address map 59. An address map comprises a source address map and a destination address map.

As illustrated in FIG. 4A, end node 51 initiates a message transmission to the tag corresponding to router 54. End node 51, which is typically in sleep mode, wakes up, and transmits message 1 to its parent node, here router 52. Upon receipt of message 1, router 52 transmits a MAC acknowledgement back to end node 51. The MAC acknowledgement signifies to end node 51, at the data link layer, that message 1 has been successfully dispatched. In response, end node 51 returns to sleep mode. Advantageously, end node 51 remains in sleep mode until its next scheduled wake-up, that is, once the brief transmission/MAC acknowledgement cycle is complete, no further expenditure of battery energy by end node 51 is required to effectuate the transmission of message 1. Message 1 includes the tag TE of the destination node (here, router 54).

Figure 4B:
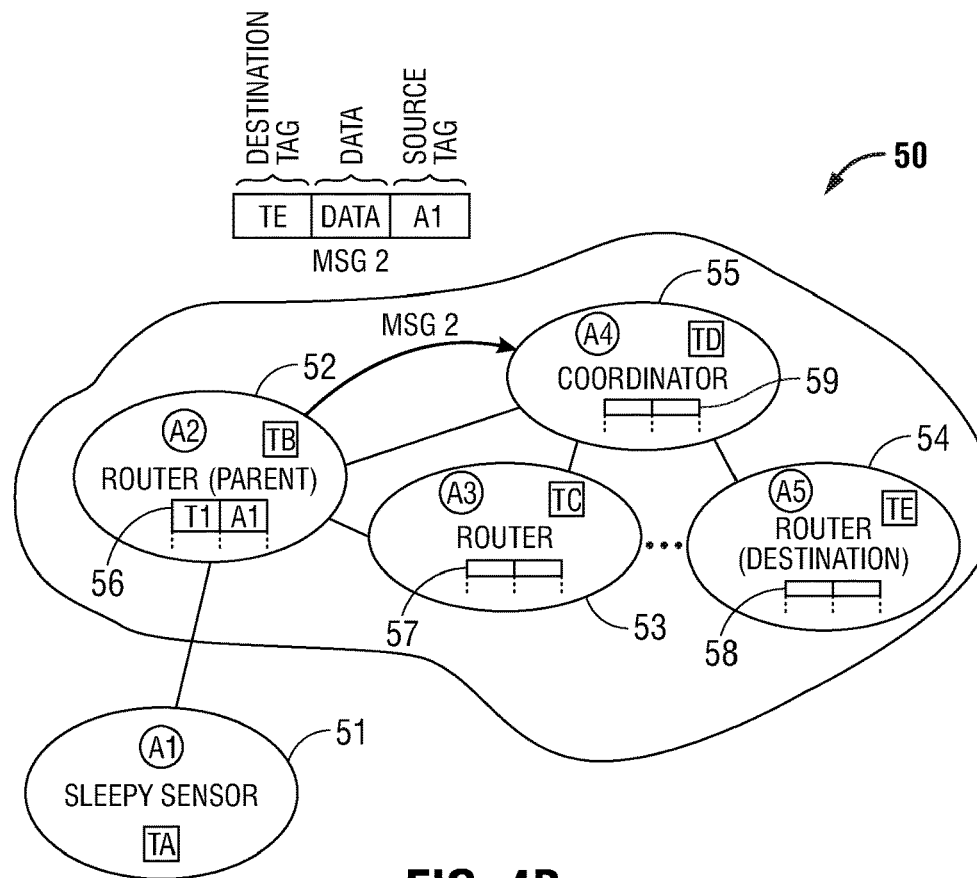

As illustrated in FIG. 4B, router 52 is now the recipient of message 1. Router 52 determines from the tag whether it is the destination for the data. If the tag in message 1 matches the tag of router 52 (TB), then router 52 accepts the data for its application. Since in this example, the tag in message 1 (TE) matches the tag of router 54 (TE), router 52 will forward the data by sending message 2 with the same tag and data as message 1, and including the data source address of end node 51 (A1). Router 52 sends message 2 through the ZigBee network to the coordinator 55, preferably using APS acks. If router 52 is not able to communicate with the coordinator, such as when the coordinator is powered down, or if the network design does not give advantage to routing messages to and from the coordinator, then router 52 instead of the coordinator finds the destination and sends message 3 to the destination as described below. The network design in the exemplary embodiment uses many-to-one routing toward the coordinator, and source routing along the same routes outbound from the coordinator, so there is an advantage to sending messages to and from the coordinator, avoiding route discovery and routing table entries for routes between other routers.

Figure 4C:
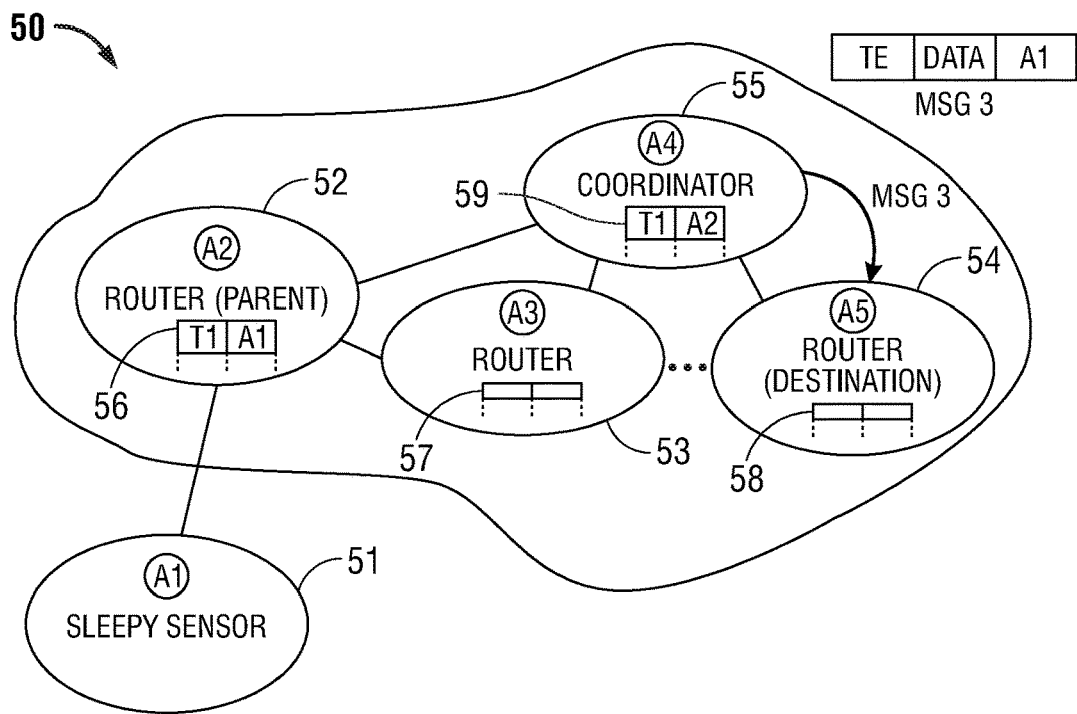

In FIG. 4C, coordinator 55 is in receipt of message 2. Routers 52, 53, 54, and 55 include source address maps 56, 57, 58, 59, respectively, in which message source addresses and corresponding data source addresses are stored. Any router that receives message 2 stores the message source address and data source address in its source address map. Source address maps facilitate the transmission of responses, if requested, from the destination back to the source without discovering a route. The coordinator determines the destination address and sends to it message 3, which contains the same tag and data as message 1 with the data source address of end node 51, preferably using APS acks. Routers include destination address maps in maps 56 et al. in which tags and corresponding destination addresses are stored. Any router that needs to send message 3 stores the tag and data destination address in its destination address map.

Figure 4D:
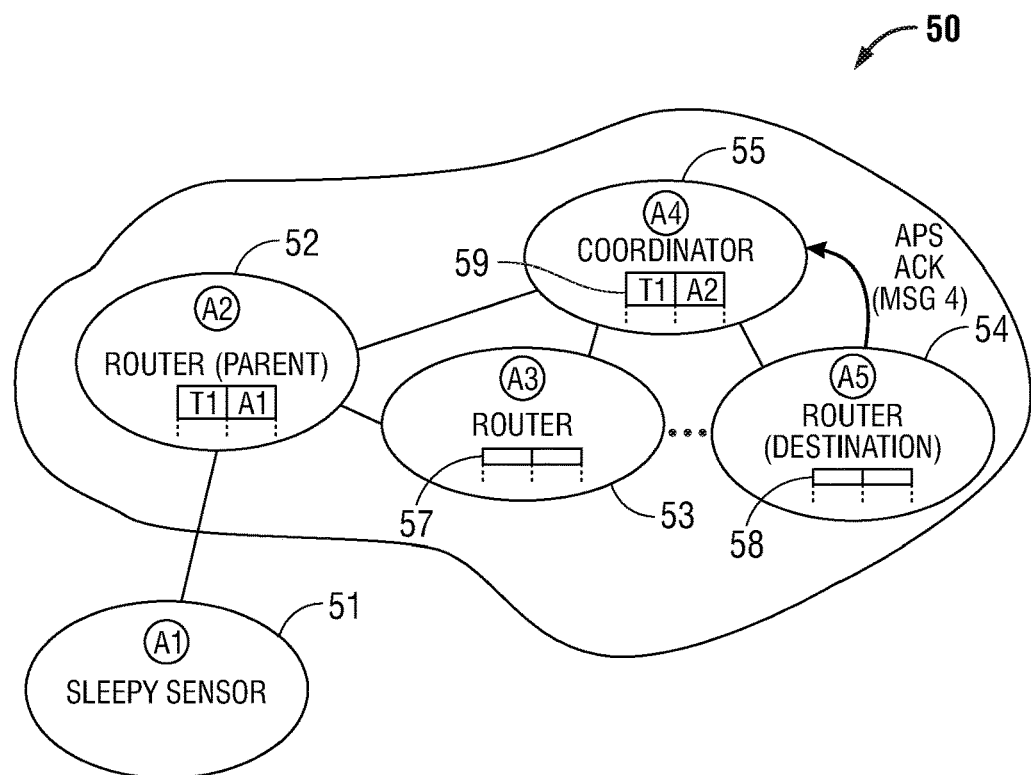
Figure 4E:
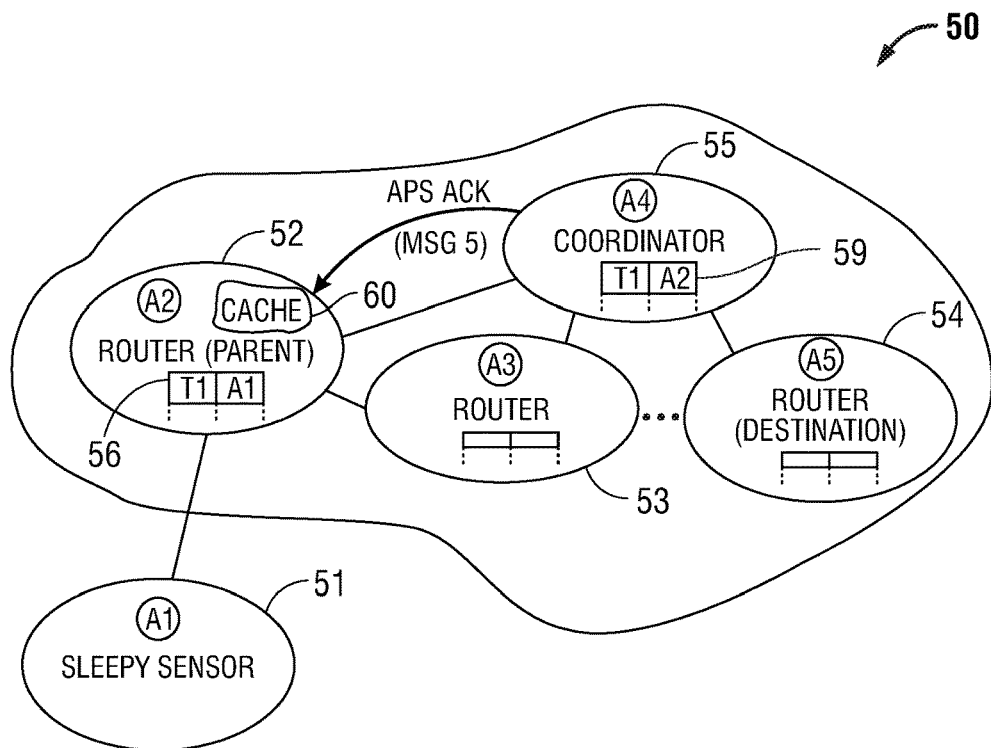

Message 3 has arrived at the destination node, router 54. If the tag in message 3 does not match the tag in router 54, then router 54 will handle message 3 in the same manner as router 52 handled message 1, and the sender of message 3 will detect when it receives a message 2 from the address stored in its destination address map that the map entry is no longer valid, whereupon it will determine the new destination address and send a new message 3. Otherwise, the tag in message 3 will match the tag in the destination, here router 54, so router 54 processes the message. For example, the destination node may act upon the message in accordance with the application function to which the message is directed, e.g., record a temperature, activate or deactivate a heat pump, and so forth will be understood by one skilled in the art. If a response was requested by the originating node, then as shown in FIG. 4D, the response message 4 containing the data source tag ID and the response is transmitted to the source of message 3 or, if the data source is a child of the destination, to the data source. When a router that has recently sent a message 3 receives a response message 4, it sends a response message 5 to the message source address corresponding to the data source address in its source address map or, if the data source is a child of the router that sent message 3, to the data source. In this case, map 59 indicates the message source corresponding to tag T1 was address A2 (router 52), therefore coordinator 53 sends response message 5 to that node (FIG. 4E).

Figure 4F:
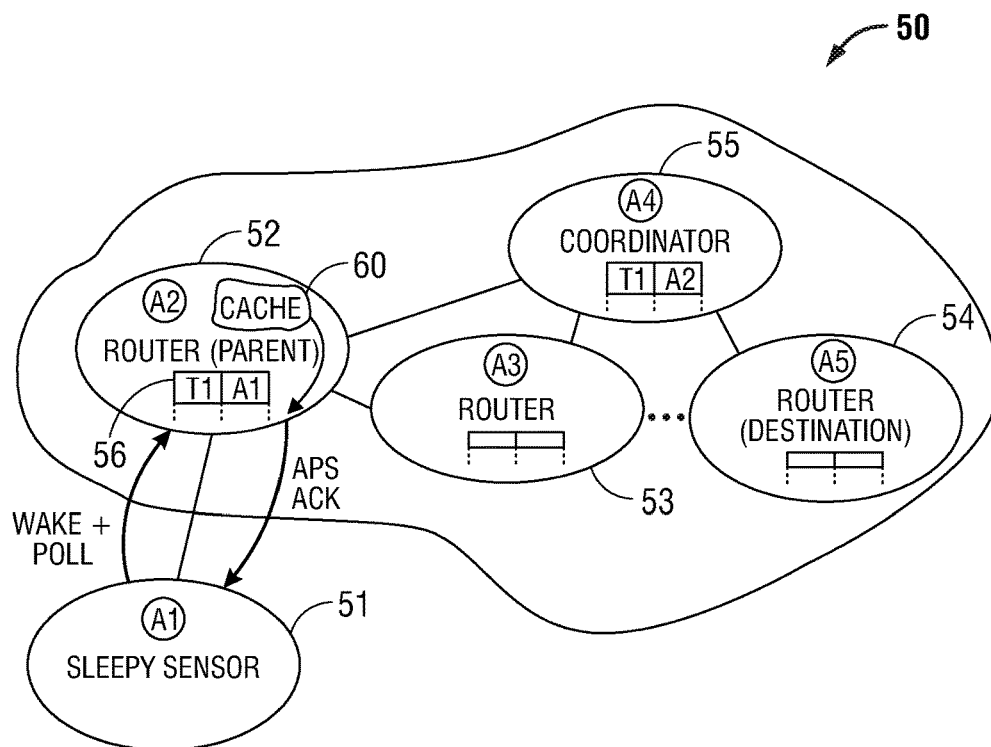

The response arrives at router 52. Router 52 determines that it is the parent node to the data source, end node 51, so it sends the response message to the data source. Since end node 51 is a device capable of sleep mode, the parent caches the message sent to the child. When the child wakes up, the child polls the parent, and receives pending cached messages from the parent (FIG. 4F).

Figure 5A:
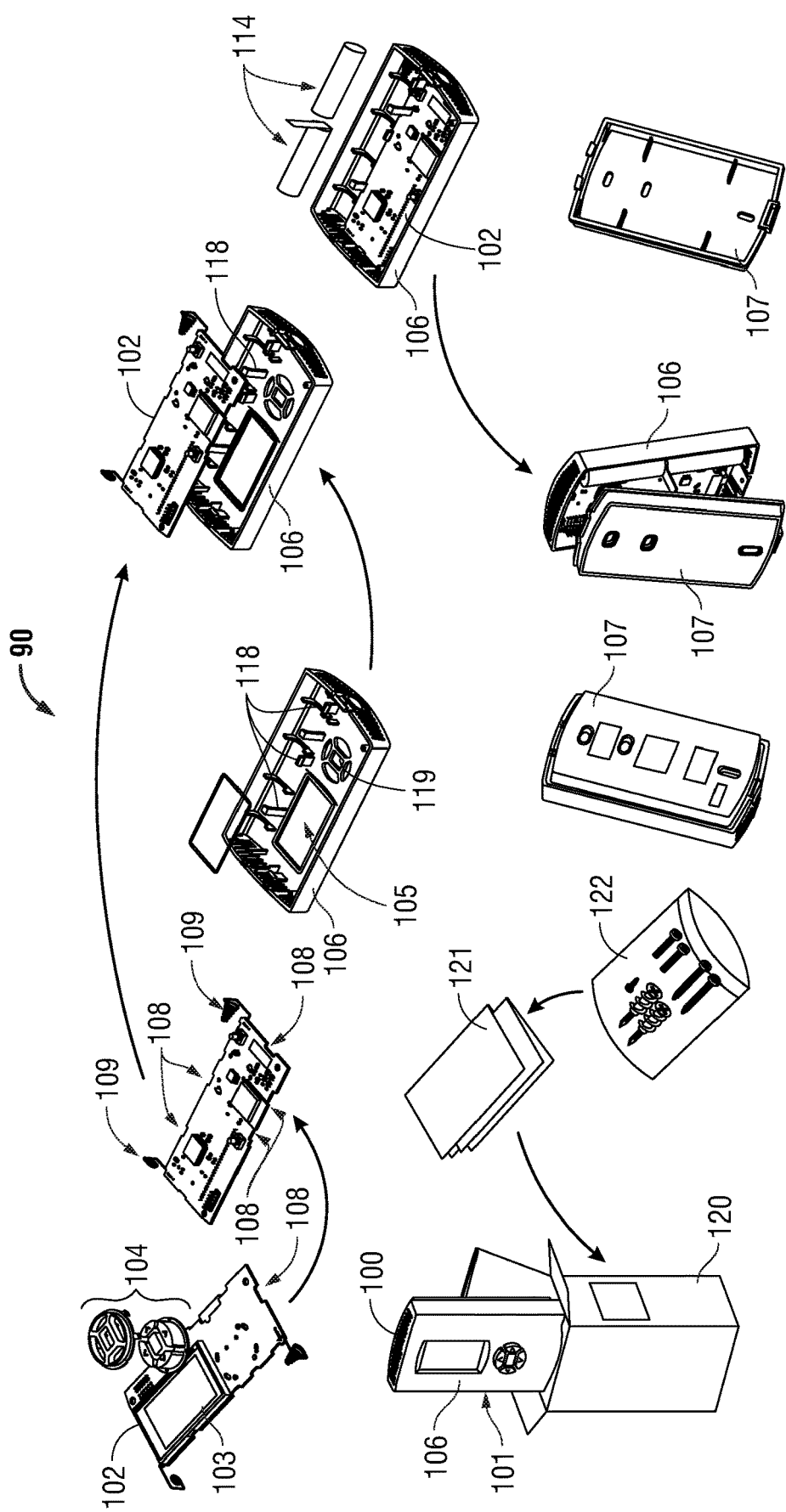
FIGS. 5A-5D present embodiments of a wireless HVAC device having a reversible printed circuit board and assemblable in a first configuration having an exposed display and second configuration having a hidden display.
Figure 5B:
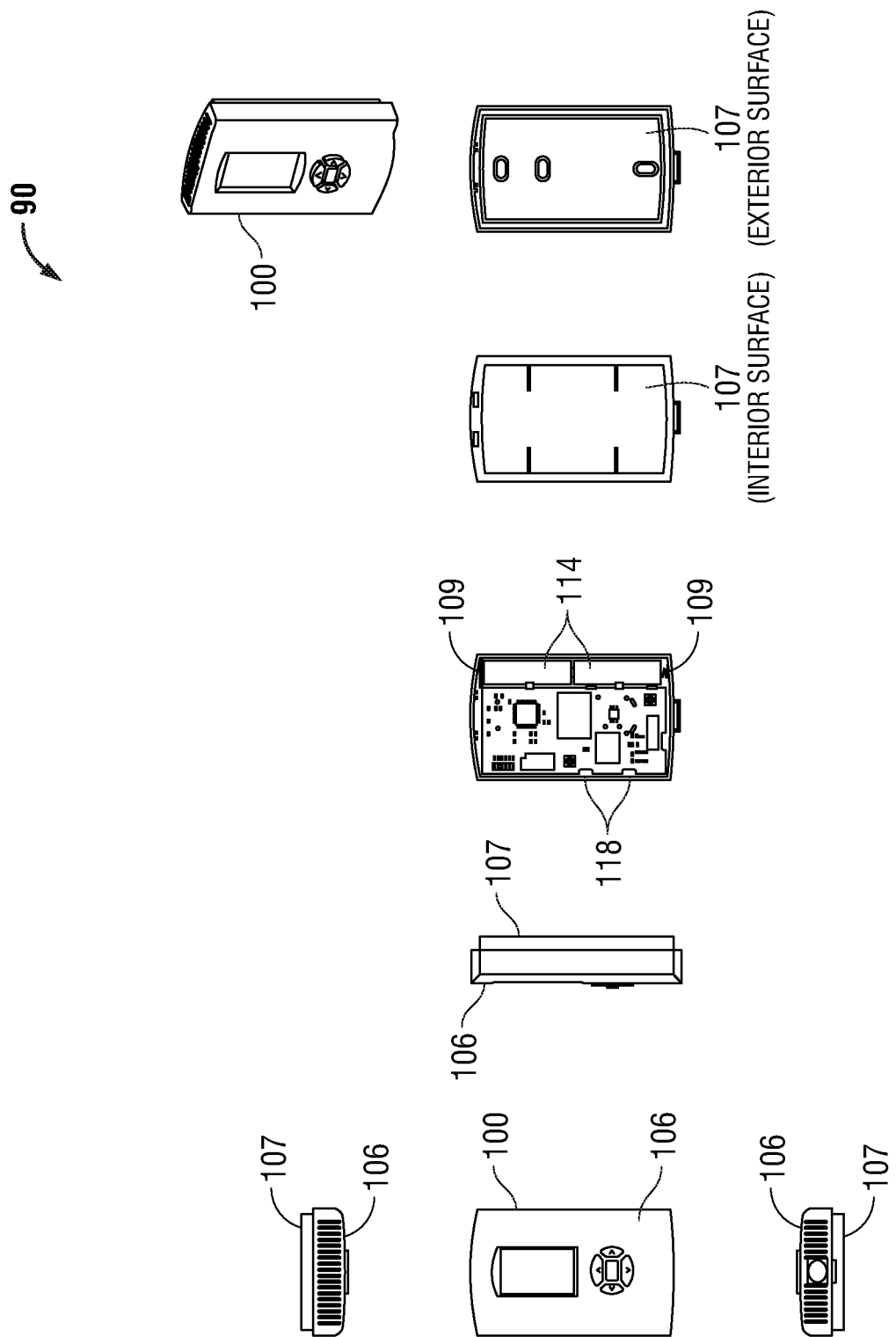
Figure 5C:
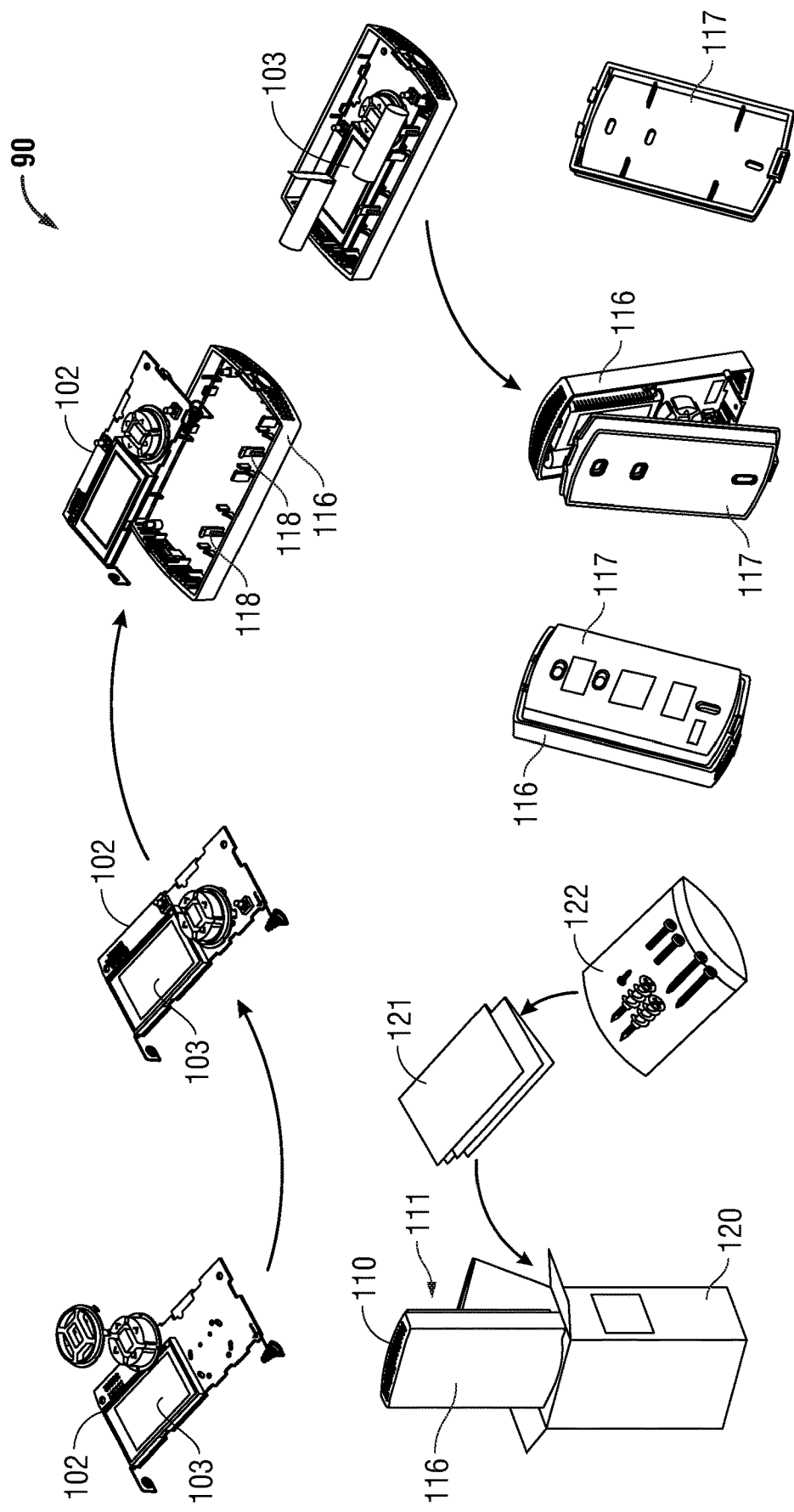
Figure 5D:
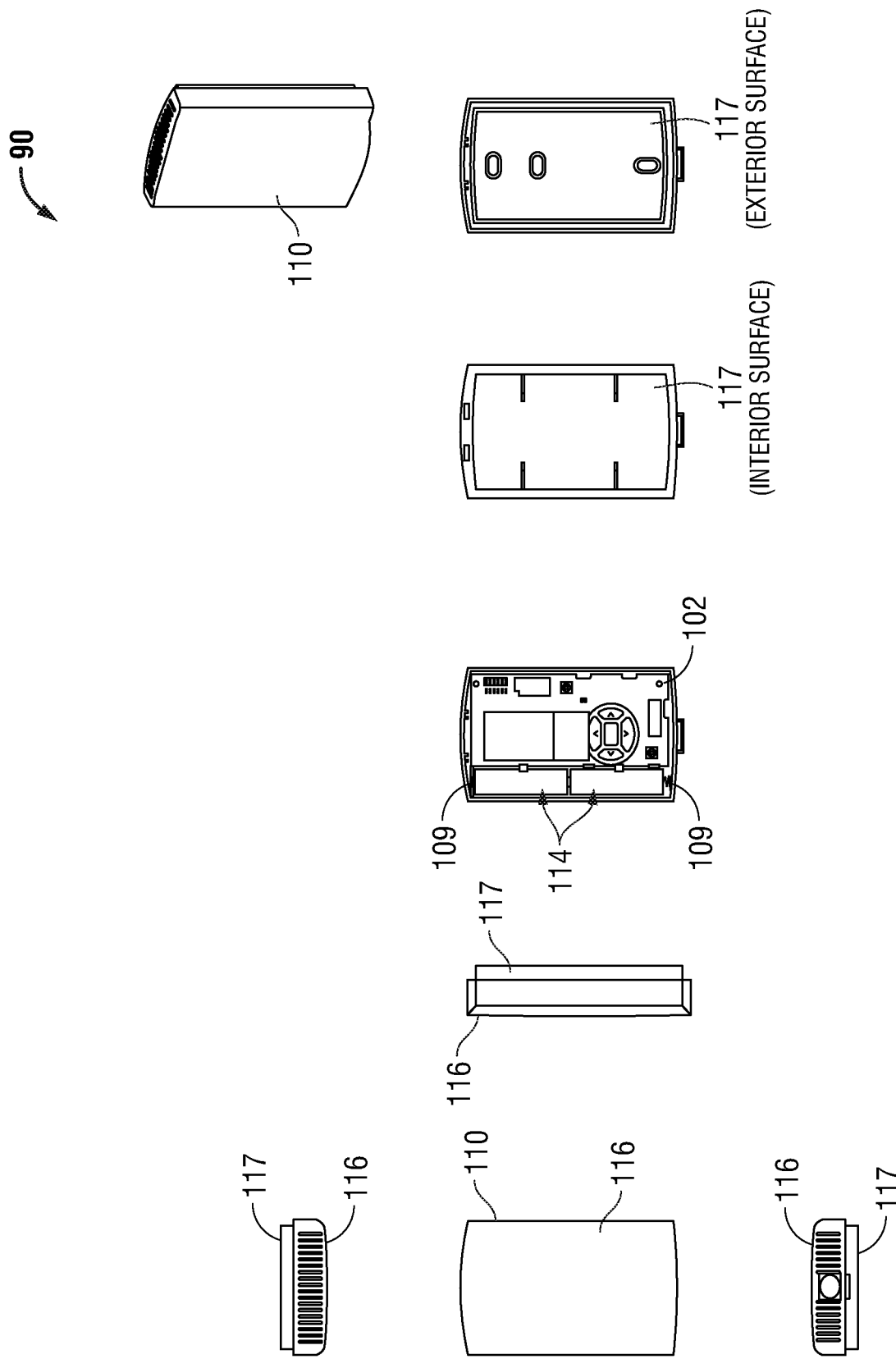

Turning now to FIGS. 5A-5D, an HVAC sensor 90 assemblable in a first configuration 100 having an exposed display, shown in FIGS. 5A and 5B, and second configuration 110 having a concealed display, shown in FIGS. 5C and 5D, is described. Advantageously, the disclosed HVAC sensor 90 utilizes a printed circuit board 102 which is utilized in both configurations, which increases economies of scale, reduces development and testing costs, and simplifies inventory control. Printed circuit board 102 includes a display side and a non-display side, and may be mounted within sensor 90 with the display side facing inward or outward, as described in detail below.

In the first, visible-display configuration 100 seen in FIGS. 5A and 5B, sensor 90 includes a housing 101 having front portion 106 generally suited for facing a user, and a rear portion 107 generally suited for attaching to a mounting surface, such as a wall. Housing front portion 106 includes a display opening 105 and one or more switch openings 119 defined therein. In the second, concealed-display configuration 110 shown in FIGS. 5C and 5D, sensor 90 includes a housing 111 having a having front portion 116 generally suited for facing a user, and a rear portion 117 generally suited for attaching to a mounting surface, such as a wall or column. In embodiments, one or more of front portion 106, front portion 116, rear portion 107, rear portion 117 and/or printed circuit board 102 may be included in an installation kit which enables an installer to select on-site which configuration (visible display or hidden display) is appropriate for a particular installation location. In some embodiments, rear portion 107 may be substituted for rear portion 117, and therefore, only one of rear portion 107 or rear portion 117 need be included in the installation kit.

Sensor 90 includes a reversible printed circuit board 102 having a display module 103 operatively mounted thereupon. In embodiments, display module 103 may include a liquid crystal display (LCD). Alternatively, an electronic paper display (e-paper) or any other suitable display which meets the low-power and environmental requirements for an HVAC sensor may be utilized, as will be appreciated by the skilled artisan. Printed circuit board 102 includes a switch assembly 104 operatively coupled thereto which enables a user to interact with sensor 90, for example, to set a device identifier, to join a wireless mesh network, to activate the display, and so forth. Printed circuit board 102 includes one or more notches 108 defined along a peripheral edge thereof that are dimensioned to effectuate snap-fit engagement with corresponding mounting tabs 118 provided by sensor housing 101 and/or sensor housing 111. Printed circuit board 102 includes a pair of battery contacts 109 which are configured to operatively engage one or more batteries 114. As best seen in FIGS. 5B and 5D, housing 101 and 111 are configured to retain the one or more batteries 114 on opposite sides for one another as required to accommodate printed circuit board 102 in its exposed display configuration 100 and in its concealed display configuration 110.

In use, an installer may use display module 103 and switch assembly 104 to perform initial setup of sensor 90, e.g., to set a device address, join a wireless mesh network, and so forth. This is readily performed in the exposed display configuration 100, since the display 103 and switch assembly 104 are openly accessible. With the concealed display configuration 110, the installer may separate the two halves of housing 111 to access the display 103 and/or switch assembly 104 concealed therewithin. Once the initial setup is complete, the housing is reassembled by reattaching front portion 116 and rear portion 117, and the sensor 90 may be placed into service. Sensor 90 may be an power-efficient HVAC sensor which includes a sleep current fault detector 3, a power-efficient method 200 of operating a wireless HVAC device, and/or other power-saving features described herein.

Figure 6:
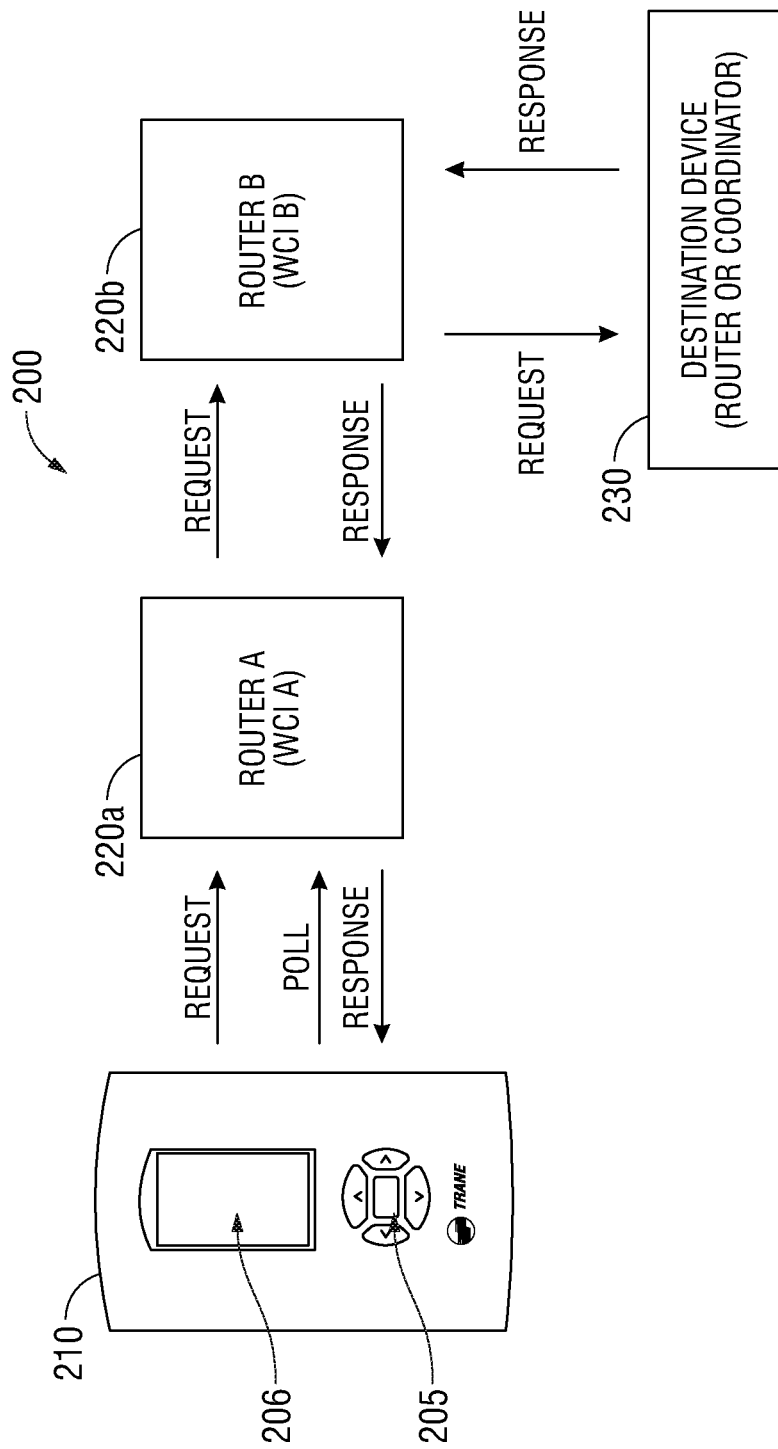
FIGS. 6 and 7 illustrate a method of extending battery life in a wireless HVAC device in accordance with an embodiment of the present disclosure.
Figure 7:
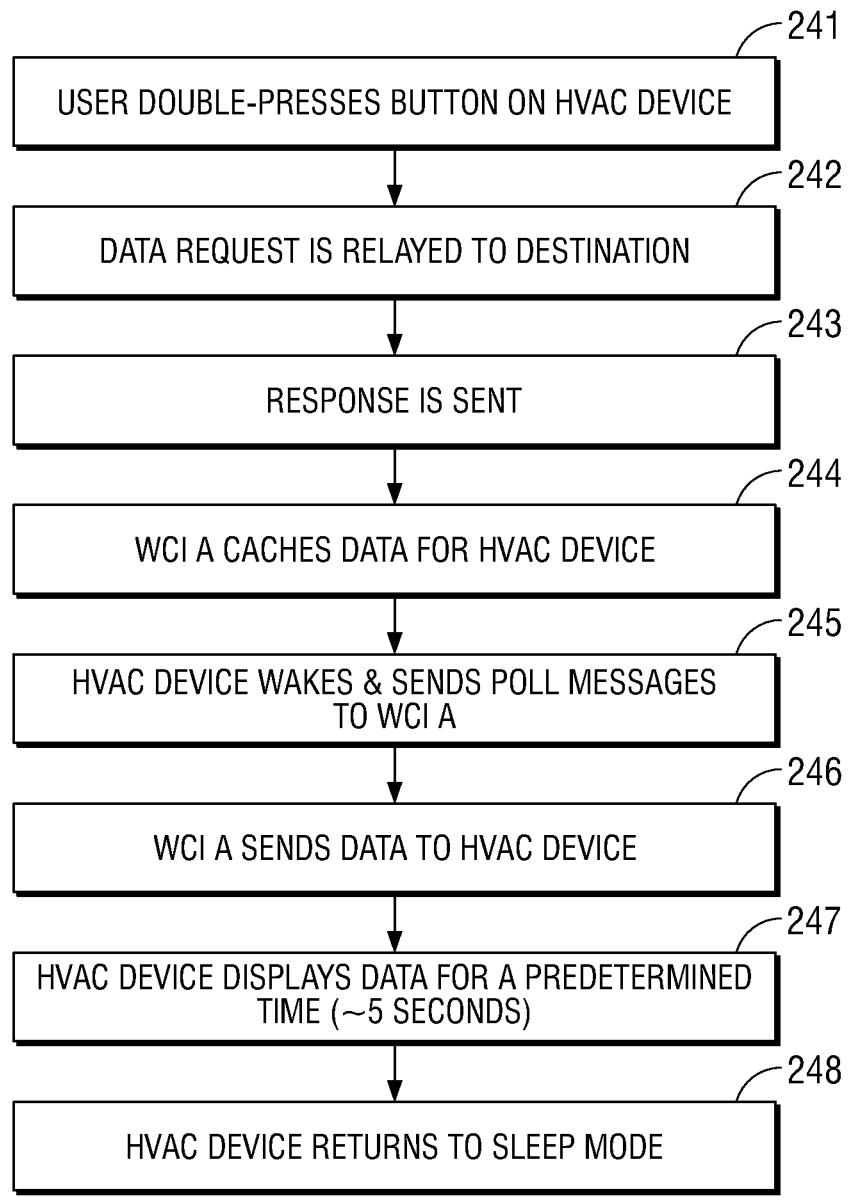

Turning to FIGS. 6 and 7, a power-efficient method 200 of operating a wireless HVAC device 210 is shown. HVAC device 210 includes switch assembly 205, a display 206, and may incorporate wireless sensor, a thermostat, and so forth. In embodiments, display 206 may include a touchscreen display. HVAC device 210 is adapted for wireless communication with one or more wireless nodes 220, 230. As shown, wireless nodes 220a, 220b, 230 include, but are not limited to, a ZigBee® routing node (e.g., a wireless communication interface or WCI) and/or a ZigBee® coordinator node.

HVAC device 210 is typically mounted upon a wall or other surface that is easily accessible to a user. At most times, HVAC device 210 operates in a low-power sleep mode, which prolongs battery life. In some embodiments, during sleep mode display 206 may display only locally-available data items, e.g., data which does not require a network transmission to obtain. In this manner, power is further conserved by preventing the network circuitry (e.g., the 802.15.4 transceiver) from powering up during sleep mode. In some embodiments, HVAC device 210 will deactivate display 206 during sleep mode in order to further conserve power. In embodiments where HVAC device 210 includes a sensor, HVAC device 210 may periodically "wake up" into an active mode, transmit the current sensor reading, then return to sleep mode.

HVAC device 210 includes the capability of presenting data on display 206, for example, it may display the locally-sensed sensor value and/or data obtained via wireless communication from another network node. Since HVAC device 210 is, during the bulk of its lifecycle, simply mounted upon a wall and not being viewed or interacted with by a user, HVAC device 210 remains in sleep mode until a display request is expressly made by a user.

In more detail, a user initiates a data display request in step 241, whereupon a user interacts with HVAC device 210 by actuating a pushbutton 205, which may be a single press, a double press, or a similar gesture. In embodiments where display 206 is a touchscreen display, a user may tap or swipe the display to initiate the request. Additionally or alternatively, a user may enter a choice of which data items the user wishes to view. For example, a single, initial actuation may cause HVAC device 210 to proceed to display a default or preselected data item (such as system temperature setpoint). Additional actuations, for example, which navigate through a series of user interface selections, menus, etc., may allow the user to select alternative data items, groups of items, and so forth. Upon user actuation, HVAC device 210 wakes up and prepares a data request message.

In step 242, HVAC device 210 transmits the data request message to the destination node, and reverts to sleep mode. The data request message is relayed by the wireless network (e.g., routers 220a, 200b) to the destination node 230. In step 243, the destination node 230 transmits the requested data to HVAC device 210. Router 220a is most adjacent node to HVAC device 210, and so it is router 220a which has the last "hop" to HVAC device 210. Router 220a attempts to relay the response to HVAC device 210. Since HVAC device 210 has previously reverted to sleep mode, and is likely still in sleep mode, router 220a is temporarily unable to transmit the response to HVAC device 210. Therefore, in step 224, router 220a caches the response and begins to await a polling message from HVAC device 210.

In step 245 HVAC device 210 wakes up and transmits a polling message to its network neighbor, e.g., router 220a. In response, in step 246 router 220a transmits the data message to HVAC device 210. In turn, in step 247 HVAC device 210 presents the requested data on display 206 for a predetermined time, for example, about 3-5 seconds, and in step 248, HVAC device 210 return to sleep mode. By seeking to keep HVAC device 210 in sleep mode and avoiding network transmissions for as long as possible, in a reliable manner, and without impacting the user experience, the disclosed methods provide extended battery life in wireless HVAC devices.

ASPECTS

It is noted that any of aspects 1-3 and aspects 4-8 below can be combined with each other in any combination, and may combined with any of aspects 9-15, any of aspects 16-24, and/or any of aspects 25-26. Any of aspects 9-15, any of aspects 16-24, and/or any of aspects 25-26 can be combined with each other in any combination.

Aspect 1. A method of sensing excessive sleep current draw in a battery-powered device having a microcontroller, the method comprising: measuring a voltage drop across a MOSFET device coupled in a forward-conducting orientation in series between the battery and the microcontroller; causing a transistor to conduct when the voltage drop exceeds a predetermined threshold to generate a first trigger signal; integrating the first trigger signal to generate a second trigger signal; and generating an interrupt to the microcontroller in response to the second trigger signal.

Aspect 2. The method in accordance with aspect 1, wherein the predetermined threshold is consistent with excessive current draw during sleep.

Aspect 3. The method in accordance with any of aspects 1-2, further comprising transmitting, from the microcontroller, a fault signal in response to the interrupt.

Aspect 4. A sleep current fault detection circuit for use with a powered device operable in a sleep mode and an awake mode; comprising: a MOSFET, the drain terminal thereof coupled to a current source, the gate terminal thereof coupled to a powered device, the source terminal thereof coupled to ground; a first transistor, the emitter terminal thereof coupled to the drain terminal of the MOSFET and configured to conduct when the voltage across the drain terminal of the MOSFET and the source terminal of the MOSFET exceeds a predetermined voltage; a second transistor, the base terminal thereof coupled to the collector of the first transistor, the collector terminal thereof coupled to an R-C filter; and a third transistor, the base terminal thereof coupled to the R-C filter, the collector terminal thereof coupled to an interrupt terminal of the powered device.

Aspect 5. The circuit in accordance with aspect 4, wherein the gate terminal of the MOSFET is coupled to an output of the powered device.

Aspect 6. The circuit in accordance with any of aspects 4-5, wherein the output of the powered device turns off the MOSFET prior to entering sleep mode.

Aspect 7. The circuit in accordance with any of aspects 4-6, wherein the output of the powered device turns on the MOSFET when entering awake mode.

Aspect 8. The circuit in accordance with any of aspects 4-7, wherein the predetermined voltage is about 0.5 volts.

Aspect 9. In a mesh network having an end node operable in a sleep mode and an awake mode, an energy-efficient method of transmitting data from the end node to a destination node, comprising: transmitting a first message, the first message including a tag ID of the destination node and message data, from the end node to a parent node of the end node; receiving, at the end node, a first acknowledgement from the parent node acknowledging receipt of the first message by the parent node; causing the end node to enter sleep mode in response to the acknowledgement; determining, at the parent node, whether the parent node is the destination node; and transmitting a second message, the second message including the destination node tag, the message data, and a network address of the parent node, to the destination node in response to determination that the parent node is not the destination node.

Aspect 10. The method in accordance with aspect 9, further comprising storing, at the parent node, a relationship between the tag ID of the end node and a network address of the node from which the intervening node received the second message.

Aspect 11. The method in accordance with any of aspects 9-10, wherein transmitting a second message including data from the first message from the parent node to the destination node includes relaying the second message through an intervening node.

Aspect 12. The method in accordance with any of aspects 9-11, further comprising: storing, at the intervening node, a relationship between the tag ID of the end node and a network address of the node from which the intervening node received the second message.

Aspect 13. The method in accordance with any of aspects 9-12, further comprising: receiving, at the parent node, a second acknowledgement from the destination node; caching the second acknowledgement at the parent node; receiving, from the end node, a poll request; and transmitting the second acknowledgement to the end node in response to the poll request.

Aspect 14. The method in accordance with any of aspects 9-13, wherein the second acknowledgement includes an application layer acknowledgement.

Aspect 15. The method in accordance with any of aspects 9-14, wherein the first acknowledgement includes a data link layer acknowledgement.

Aspect 16. A method of extending battery life in a wireless HVAC component operable in a sleep mode having a first power consumption and in an awake mode having a greater power consumption than when the component is in the first mode, the method comprising: operating the HVAC component in the sleep mode; receiving, at a user interface element of the HVAC component, a user input; operating the HVAC component in the awake mode; transmitting, from the HVAC component, a data request message, wherein the data request message includes a device identifier of the destination device from which the data is requested; returning the HVAC component to the sleep mode; forwarding the data request message to the destination device; transmitting, from the destination device, a response to the data request message; returning the HVAC component to the awake mode; polling an adjacent network node by the HVAC component; receiving, at the HVAC component, the response to the data request message; displaying, on the HVAC component, information derived from the response and; returning the HVAC component to the sleep mode.

Aspect 17. The method in accordance with aspect 16, further comprising caching, at an adjacent network node, the response to the data request message.

Aspect 18. The method in accordance with any of aspects 16-17, wherein the user interface element is selected from the group consisting of a pushbutton and a proximity sensor.

Aspect 19. The method in accordance with any of aspects 16-18, wherein the forwarding includes relaying the data request message through one or more intervening devices.

Aspect 20. The method in accordance with any of aspects 16-19, wherein the data request message includes a data item selected from the group consisting of a set point, a mode indicator, a temperature indicator, an HVAC system status, a fuel indicator, an energy indicator, a battery level indicator, and a signal strength indicator.

Aspect 21. The method in accordance with any of aspects 16-20, wherein the mode indicator is selected from the group consisting of a cooling mode indicator, a heating mode indicator, a fan mode indicator, a ventilation mode indicator, and a service mode indicator.

Aspect 22. The method in accordance with any of aspects 16-21, wherein the temperature indicator is selected from the group consisting of an indoor temperature, an outdoor temperature, a refrigerant temperature, an HVAC equipment inlet temperature, and an HVAC equipment outlet temperature.

Aspect 23. The method in accordance with any of aspects 16-22, wherein the fuel indicator is selected from the group consisting of a fuel flow rate indicator, a fuel level indicator, and a fuel pressure indicator.

Aspect 24. The method in accordance with any of aspects 16-23, wherein the energy indicator is selected from the group consisting of a voltage indicator, a current indicator, and an alternating current frequency indicator, a utility energy source indicator and a backup energy source indicator.

Aspect 25. A kit for manufacturing an HVAC sensor assemblable in a first configuration having an exposed display and second configuration having a hidden display, the kit comprising: a printed circuit board having a display side and a non-display side, the display side including a display module disposed thereon; a first housing assembly having a user surface and a mounting surface; the user surface having a display opening defined therein; the first housing assembly configured to operatively receive the printed circuit board whereby the display module faces the user surface and is visible through the display opening; and a second housing assembly having a user surface and a mounting surface and configured to operatively receive the printed circuit board whereby the display module faces an interior surface of the housing.

Aspect 26. The kit in accordance with aspect 25, wherein: the printed circuit board further comprises a switch assembly disposed on the display side thereof; the first housing assembly further comprises a switch assembly opening defined in the user surface thereof, the switch assembly opening configured to operably receive the switch assembly.

Particular embodiments of the present disclosure have been described herein, however, it is to be understood that the disclosed embodiments are merely examples of the disclosure, which may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in any appropriately detailed structure.

What is claimed is:

1. A wireless HVAC device, comprising:
    a microcontroller capable of operating in a full-power mode and a low-power mode;
    a wireless network interface;
    an input device;
    a battery having a positive and a negative terminal, wherein the battery is configured to provide operating power to the microcontroller, the wireless network interface, and the input device; and
    a sleep current fault detector configured to detect excessive current draw from the battery when the microcontroller is operating in a low-power mode, comprising:
        a MOSFET coupled in series between a negative terminal of the battery and a system ground;
        a transistor coupled to the MOSFET and configured to conduct when the current flow through the MOSFET exceeds a predetermined threshold to indicate a sleep power fault; and
        a buffered gain stage coupled to the transistor configured to trigger an interrupt terminal of the microcontroller when a sleep power fault is indicated.

2. The wireless HVAC device in accordance with claim 1, wherein the buffered gain stage comprises an R-C network configured to delay a sleep power fault indication to prevent false positives from triggering the interrupt terminal of the microcontroller.

3. The wireless HVAC device in accordance with claim 1, further comprising a display, wherein the battery is further configured to provide operating power to the display.

4. The wireless HVAC device in accordance with claim 3, wherein the microcontroller, in response to a sleep power fault indication, causes a sleep power fault message to be presented on the display.

5. The wireless HVAC device in accordance with claim 1, wherein the microcontroller, in response to a sleep power fault indication, causes a sleep power fault message to be transmitted.

6. The wireless HVAC device in accordance with claim 1, wherein the microcontroller, in response to a sleep power fault indication, causes a section of the HVAC device to power down to isolate the cause of the sleep power fault indication.

* * * * *